(12) United States Patent
Ishii et al.

(10) Patent No.: US 10,998,220 B2
(45) Date of Patent: May 4, 2021

(54) SUBSTRATE HOLDING/ROTATING DEVICE, SUBSTRATE PROCESSING APPARATUS INCLUDING THE SAME, AND SUBSTRATE PROCESSING METHOD

(71) Applicant: SCREEN Holdings Co., Ltd., Kyoto (JP)

(72) Inventors: Hiroaki Ishii, Kyoto (JP); Ryo Muramoto, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 15/901,960

(22) Filed: Feb. 22, 2018

(65) Prior Publication Data

US 2018/0277417 A1  Sep. 27, 2018

(30) Foreign Application Priority Data

Mar. 24, 2017  (JP) .............................. JP2017-060022

(51) Int. Cl.
*H01L 21/687* (2006.01)
*H01L 21/67* (2006.01)
*H01L 21/306* (2006.01)

(52) U.S. Cl.
CPC .. *H01L 21/68764* (2013.01); *H01L 21/30604* (2013.01); *H01L 21/6708* (2013.01); *H01L 21/67028* (2013.01); *H01L 21/67051* (2013.01); *H01L 21/68728* (2013.01); *H01L 21/68742* (2013.01); *H01L 21/68785* (2013.01)

(58) Field of Classification Search
None
See application file for complete search history.

(56) References Cited

U.S. PATENT DOCUMENTS

| | | | | |
|---|---|---|---|---|
| 8,038,838 | B2 * | 10/2011 | Kim | H01L 21/68742 |
| | | | | 118/730 |
| 9,385,020 | B2 * | 7/2016 | Kato | H01L 21/68728 |
| 10,128,139 | B2 * | 11/2018 | Kobayashi | H01L 21/67051 |
| 10,192,771 | B2 * | 1/2019 | Kaba | H01L 21/68742 |
| 10,283,380 | B2 * | 5/2019 | Nishiyama | H01L 21/67051 |
| 2004/0159343 | A1 | 8/2004 | Shimbara et al. | 134/33 |
| 2006/0102289 | A1 | 5/2006 | Fukatsu et al. | 156/345.55 |
| 2007/0144563 | A1 | 6/2007 | Araki | 134/84 |

(Continued)

FOREIGN PATENT DOCUMENTS

| | | |
|---|---|---|
| JP | 2003-197718 A | 7/2003 |
| JP | 2004-048034 A | 2/2004 |

(Continued)

*Primary Examiner* — Sylvia MacArthur
(74) *Attorney, Agent, or Firm* — Ostrolenk Faber LLP

(57) ABSTRACT

The substrate holding/rotating device includes a plurality of movable pins each having a support portion in contact with a peripheral edge portion of the substrate to support the substrate, and a rotation unit which rotates the plurality of movable pins around the rotation axis, a support portion of each of the movable pins included in a first pin group is disposed so as to move between a first hold position included hold positions, the first hold position close to a rotation axis and a second hold position included the hold positions, the second hold position far apart from the first hold position to one in a circumferential direction and also so as to move between the first and second hold positions and an open position far apart from the rotation axis.

19 Claims, 26 Drawing Sheets

(56) References Cited

U.S. PATENT DOCUMENTS

| | | | |
|---|---|---|---|
| 2008/0052948 A1 | 3/2008 | Kim et al. | 34/317 |
| 2008/0127888 A1 | 6/2008 | Kim et al. | 118/52 |
| 2013/0152971 A1* | 6/2013 | Kato | H01L 21/68728 |
| | | | 134/21 |
| 2014/0097580 A1* | 4/2014 | Lach | H01L 21/67051 |
| | | | 279/123 |
| 2015/0258553 A1 | 9/2015 | Kobayashi et al. | |
| 2015/0279708 A1 | 10/2015 | Kobayashi et al. | |
| 2016/0096205 A1 | 4/2016 | Kato | |
| 2016/0284585 A1* | 9/2016 | Kobayashi | H01L 21/67742 |
| 2017/0092530 A1* | 3/2017 | Kaba | H01L 21/68792 |
| 2017/0092532 A1* | 3/2017 | Kaba | H01L 21/67051 |
| 2018/0277417 A1* | 9/2018 | Ishii | H01L 21/68764 |

FOREIGN PATENT DOCUMENTS

| | | |
|---|---|---|
| JP | 2004-115872 A | 4/2004 |
| JP | 2004-235448 A | 8/2004 |
| JP | 2008-135750 A | 6/2008 |
| KR | 10-2008-0020036 A | 3/2008 |
| KR | 10-0857233 B1 | 9/2008 |
| TW | 201508859 A | 3/2015 |
| TW | 201539627 A | 10/2015 |
| TW | 201539628 A | 10/2015 |

* cited by examiner

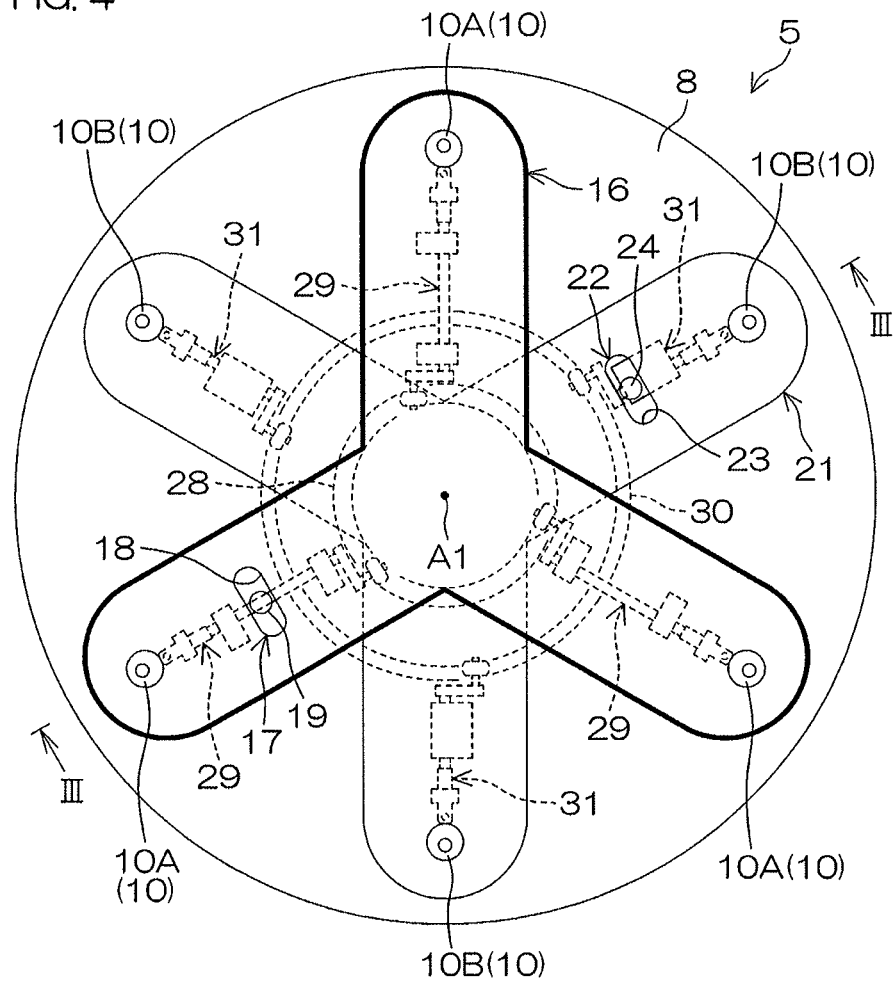

FIG. 5A  Hold position
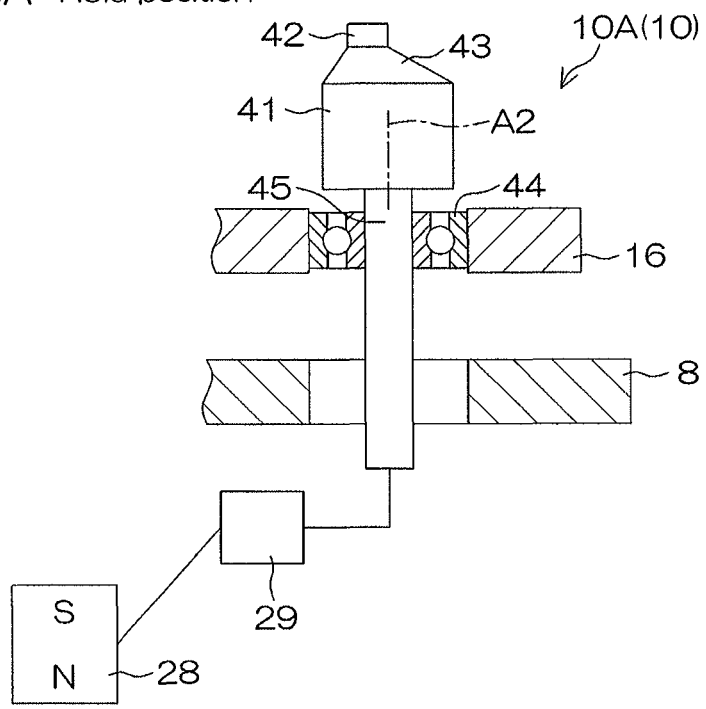
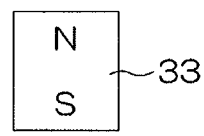
Inside ⟵⟶ outside

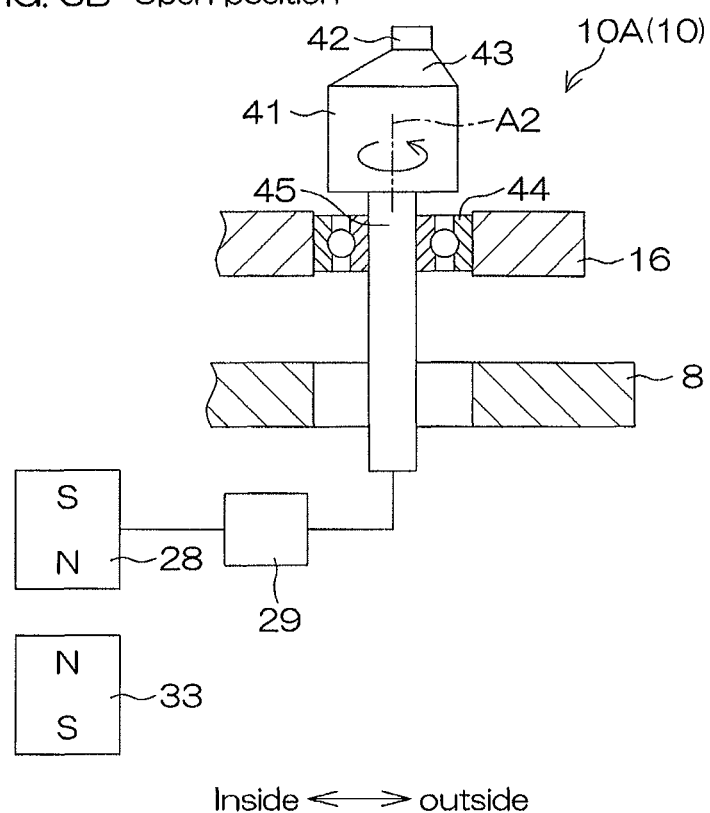
FIG. 5B Open position

FIG. 6A Hold position
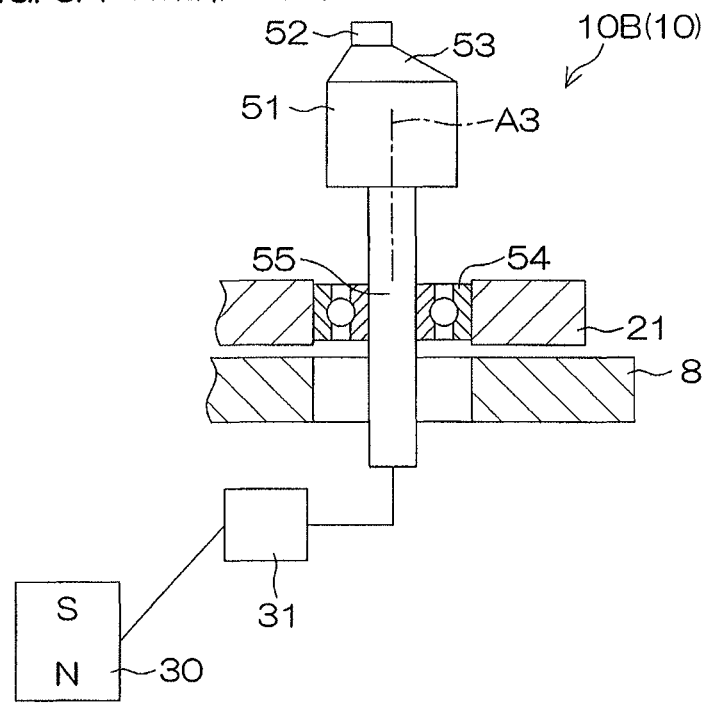
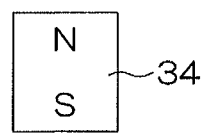
Inside ⟷ outside

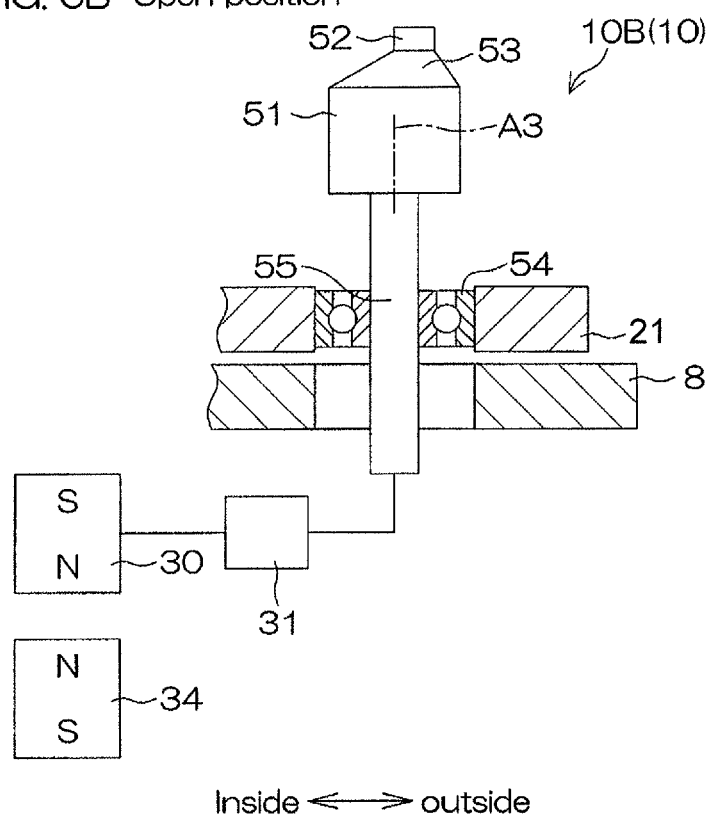

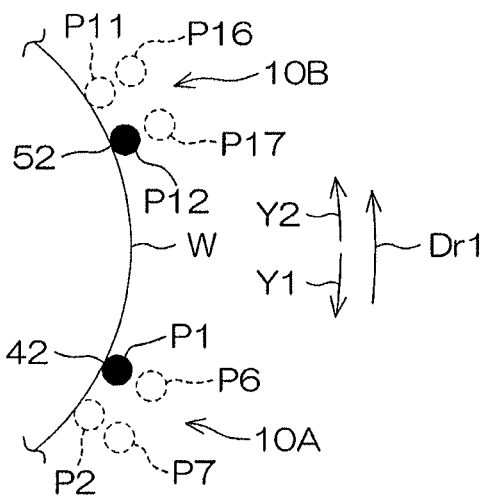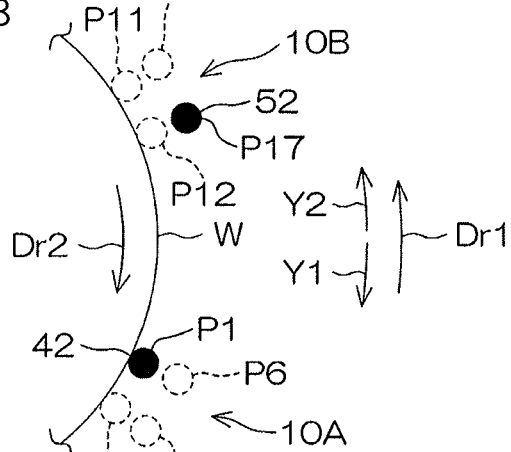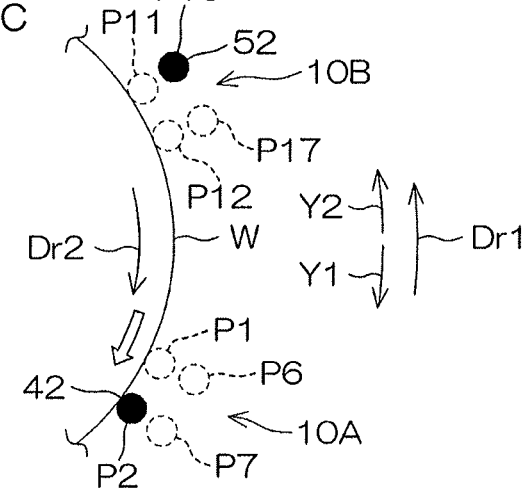

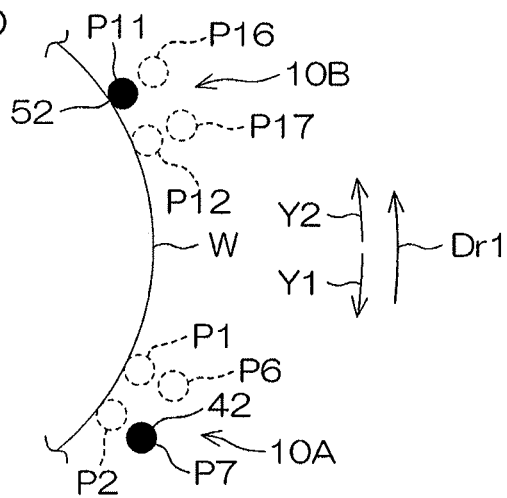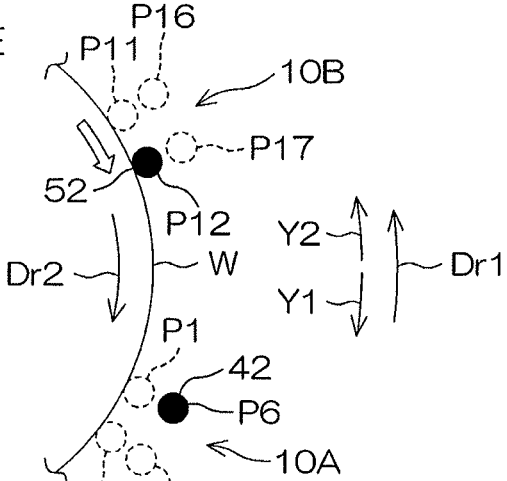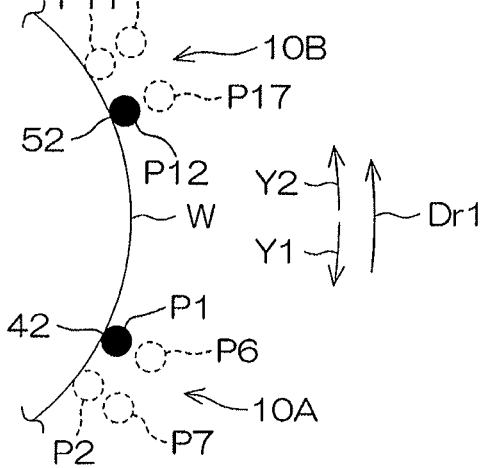

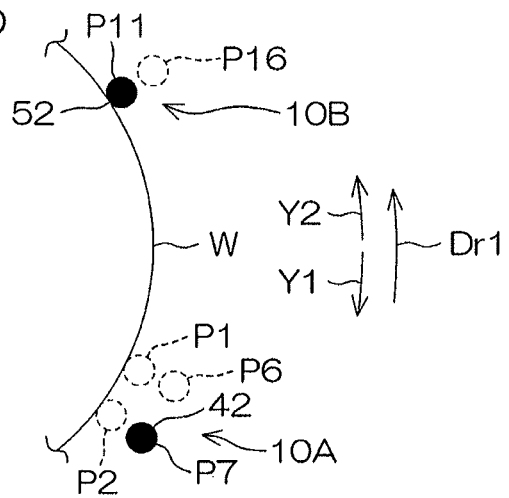
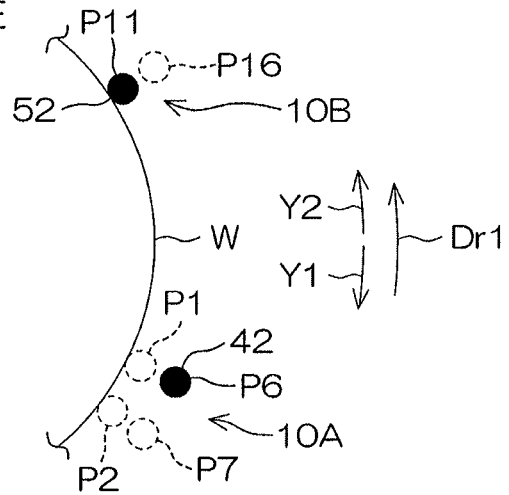
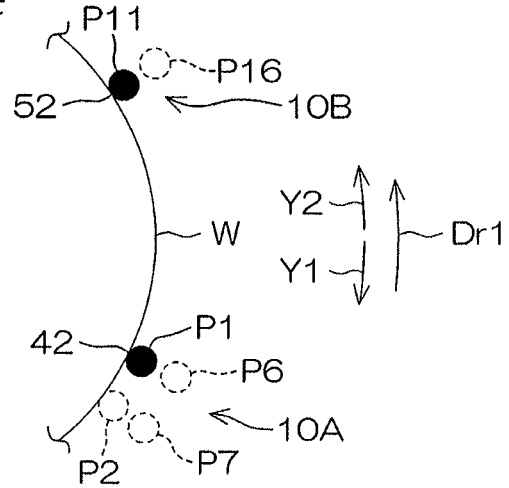

FIG. 14A  Hold position
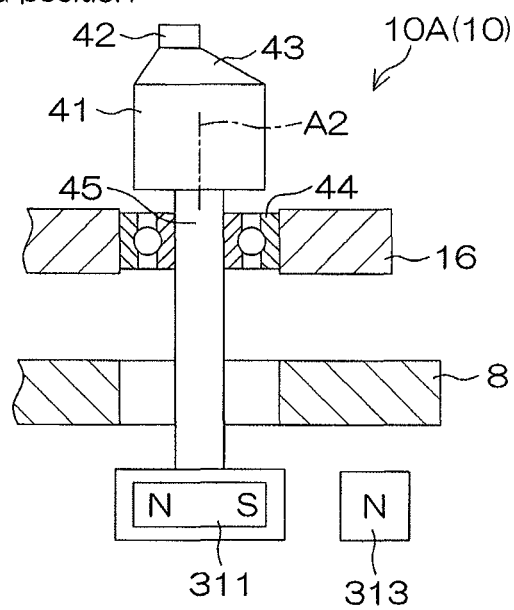
Inside ⟵⟶ outside
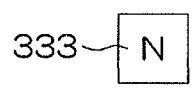

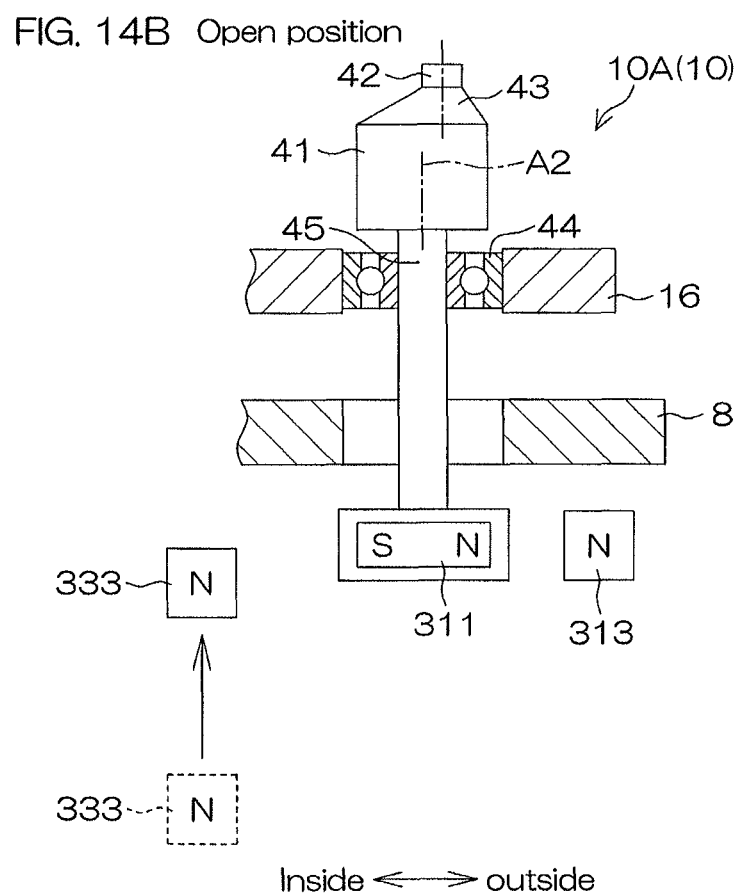

FIG. 15A Hold position
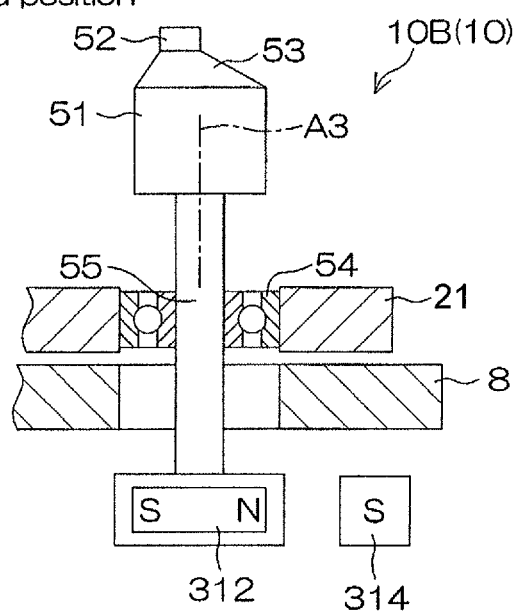
Inside ⟷ outside
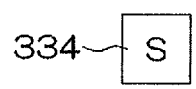

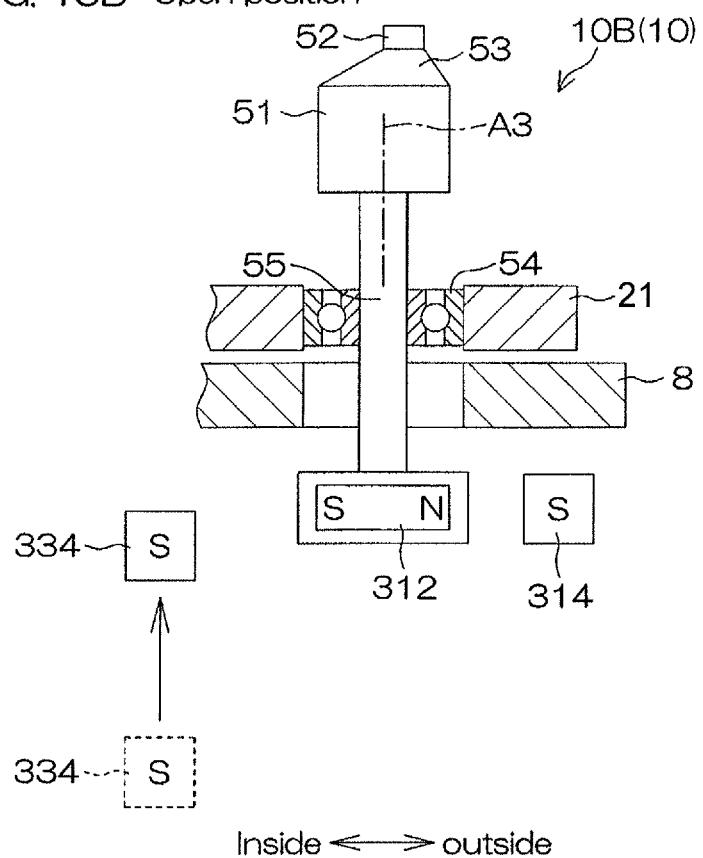
FIG. 15B Open position

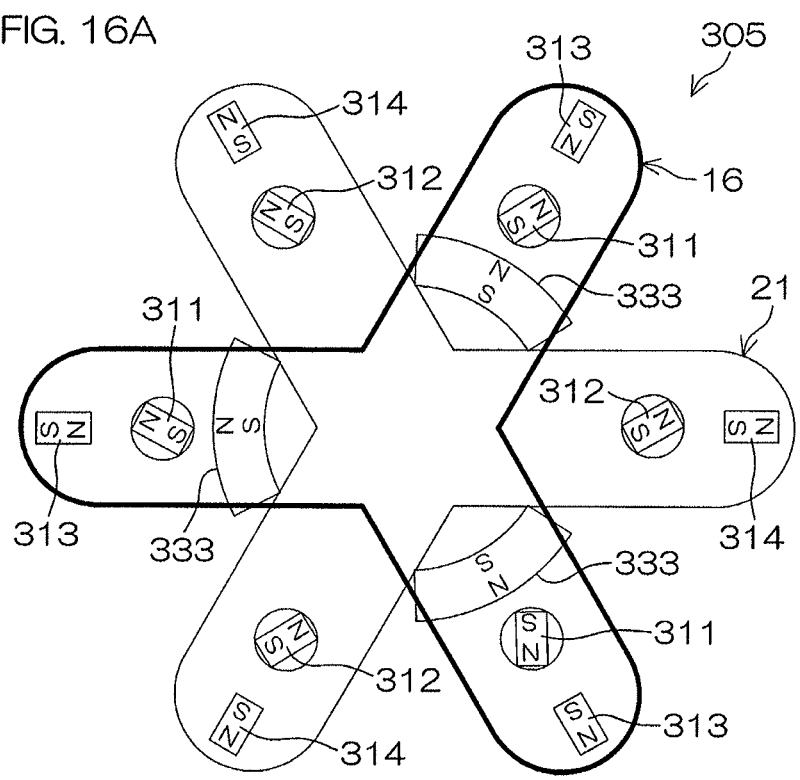

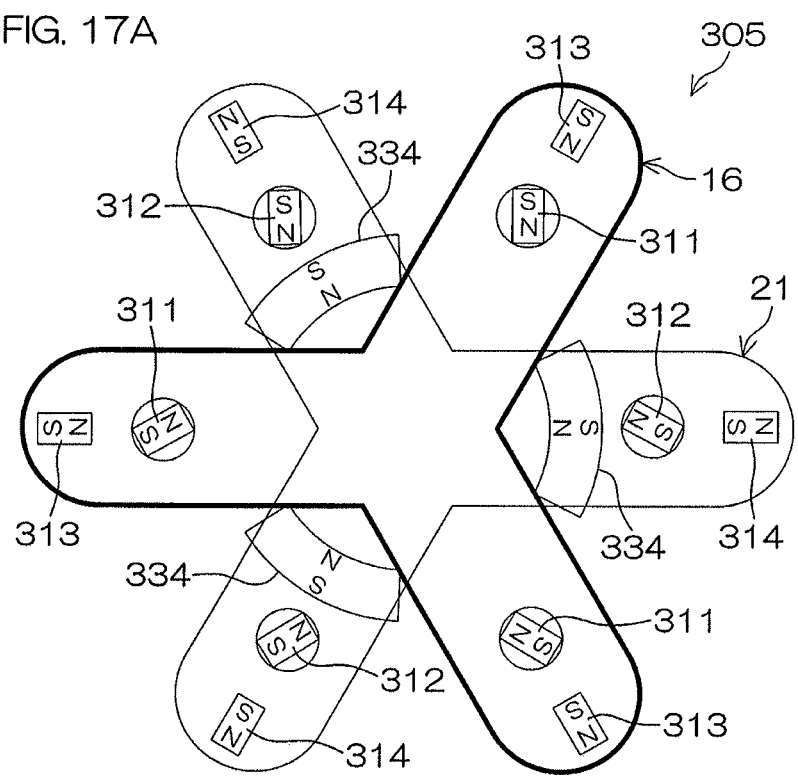

SUBSTRATE HOLDING/ROTATING DEVICE, SUBSTRATE PROCESSING APPARATUS INCLUDING THE SAME, AND SUBSTRATE PROCESSING METHOD

BACKGROUND OF THE INVENTION

1. Field of the Invention

The present invention relates to a substrate holding/rotating device, a substrate processing apparatus including the same, and a substrate processing method. Examples of substrates to be held or substrates to be processed include a semiconductor wafer, a substrate for use in liquid crystal display devices, a substrate for use in plasma displays, a substrate for use in FEDs (field emission displays), a substrate for use in optical disks, a substrate for use in magnetic disks, a substrate for magnet-optical disks, a substrate for use in photomasks, a ceramic substrate, a substrate for use in solar batteries, etc.

2. Description of Related Art

In a process for manufacturing semiconductor devices and liquid crystal display devices, semiconductor wafers and substrates such as a glass substrate for liquid crystal display devices are processed by using a processing liquid. A single substrate processing type substrate processing apparatus which processes substrates one at a time is provided with, for example, a spin chuck which holds a substrate horizontally to rotate it and a processing liquid supplying unit which supplies a processing liquid to an upper surface of the substrate held by the spin chuck. As the spin chuck, there is from time to time adopted a clamping type chuck in which a plurality of clamping members are brought into contact with a peripheral edge portion of the substrate to hold the substrate horizontally by clamping the substrate in a horizontal direction.

In the clamping type chuck, the plurality of clamping members are disposed on a circumference corresponding to an outer circumferential shape of the substrate, with an appropriate interval retained. When the plurality of clamping members are constantly in contact with the substrate, there is a possibility that a processing failure may occur at a contact support position of the clamping member on a peripheral edge portion of the substrate. Specifically, there is a possibility that unprocessed portions may occur in association with unsatisfactory feeding of a processing liquid at a contact support position on the peripheral edge portion of the substrate or, in contrast, the processing liquid may be fed all the way to an opposite side via the clamping members to distort a processing width at the peripheral edge portion of an opposite surface thereof.

In order to solve above-described problems, US Unexamined Patent Application Publication No. 2004/0159343 A1 discloses a spin chuck which includes a spin base, a first opening/closing mechanism in which, of six clamping members disposed upright at a peripheral edge portion of the spin base, three clamping members are displaced between a clamping position and a unclamping position to open and close these clamping members, and a second opening/closing mechanism in which, of the six clamping members, the remaining three clamping members are displaced between the clamping position and the unclamping position to open and close these clamping members. In the above-described spin chuck, a first clamping state in which the substrate is clamped by the first clamping member group, with rotation of the substrate retained, while the substrate is not clamped by the second clamping member group is shifted by way of an intermediate state that the substrate is clamped by the first and second clamping member groups to a second clamping state in which the substrate is clamped by the second clamping member group while the substrate is not clamped by the first clamping member group. Therefore, in parallel with processing by using a processing liquid, the plurality of mutually different clamping members are used to alternately hold the substrate. That is, clamping members in contact with the peripheral edge portion of the substrate are exchanged to suppress as much as possible an influence of processing from the clamping members in parallel with processing by using the processing liquid.

SUMMARY OF THE INVENTION

However, a contact support position of a clamping member at a peripheral edge portion of a substrate remains unchanged. Therefore, as shown in Patent Document 1, even if the substrate is alternately held by using clamping members, there is a possibility that a processing failure may occur most probably at the contact support position. In this case, there is a possibility that the substrate may be processed later at the contact support position on the peripheral edge portion than that at other regions on the peripheral edge portion.

Uniform processing is needed at various sites on a peripheral edge portion of a substrate. It is, therefore, desired that a contact support position on the peripheral edge portion of the substrate is shifted along a circumference while the substrate is rotated. That is, it is necessary to change a contact support position by a movable pin (clamping member) at the peripheral edge portion of the substrate in parallel with rotation of the substrate, with the substrate satisfactorily held by a substrate holding/rotating device (spin chuck).

Thus, one object of the present invention is to provide a substrate holding/rotating device capable of changing a contact support position at a peripheral edge portion of a substrate, while satisfactorily holding the substrate. Another object of the present invention is to provide a substrate processing apparatus and a substrate processing method which are able to satisfactorily process an entire area on the peripheral edge portion of the substrate.

The present invention provides a substrate holding/rotating device which rotates a substrate around a predetermined rotation axis extending along a vertical direction while holding the substrate horizontally, that is, the substrate holding/rotating device which includes a plurality of movable pins arranged along the circumference at the center of the rotation axis, the movable pins each having a support portion in contact with a peripheral edge portion of the substrate to support the substrate, and a rotation unit which rotates the plurality of movable pins around the rotation axis, in which the plurality of movable pins include a first pin group which includes at least three movable pins and a second pin group which includes at least three movable pins, the support portion of each of the movable pins included in the first pin group is disposed so as to move between a predetermined first hold position included hold positions, the first hold position close to the rotation axis and a predetermined second hold position included the hold positions, the second hold position close to the rotation axis and far apart the first hold position to one in the circumferential direction, and also so as to move between the first and second hold positions and an open position far apart the rotation axis, the support portion of each of the movable pins included in the second pin group is disposed so as to move between the hold position close to the rotation axis and the open position far apart from the rotation axis, where the support portion of each of the movable pins included in the first pin group is at the hold position and also the support portion of each of the movable pins included in the second pin group is at the open position, the substrate can be supported by each of the movable pins included in the first pin group, and the substrate holding/rotating device further including a first movement unit which moves in the circumferential direction the support portion of each of the movable pins included in the first pin group between the first hold position and the second hold position, with the hold position retained.

According to the above-described configuration, in a state that the support portion of each of the movable pins included in the first pin group is at the hold position and also the support portion of each of the movable pins included in the second pin group is at the open position, the substrate is supported by each of the movable pins included in the first pin group. In this state, the support portion of each of the movable pins included in the first pin group is moved in the circumferential direction from the first hold position to the second hold position, by which the substrate is allowed to move rotationally around the rotation axis. Thereby, the substrate can be changed in contact support position at the peripheral edge portion thereof, while the substrate is satisfactorily held horizontally.

In one preferred embodiment of the present invention, the first movement unit includes a first circumferential direction movement unit which moves each of the movable pins included in the first pin group between a first circumferential direction position and a second circumferential direction position far apart from the first circumferential direction position to one in the circumferential direction. The first hold position is the hold position of the support portion when each of the movable pins included in the first pin group is at the first circumferential direction position, and the second hold position is the hold position of the support portion when each of the movable pins included in the first pin group is at the second circumferential direction position.

According to the above-described configuration, each of the movable pins included in the first pin group is moved between the first circumferential direction position and the second circumferential direction position far apart from the first circumferential direction position to one in the circumferential direction. The hold position of the support portion of each of the movable pins included in the first pin group when it is at the first circumferential direction position is given as a first hold position and also the hold position of the support portion of each of the movable pins included in the first pin group when being at the second circumferential direction position is given as a second hold position and, thereby, it is possible to realize a configuration in which the support portion of each of the movable pins included in the first pin group is disposed so as to move between the first hold position and the second hold position by a relatively simple configuration.

The substrate holding/rotating device may further include a spin base to which the rotation unit is connected and a pin support member which is disposed so as to rotate together with the spin base and also so as to move rotationally relatively with respect to the spin base, thereby supporting each of the movable pins included in the first pin group. In this case, each of the movable pins included in the second pin group is disposed so as to rotate together with the spin base, and the first circumferential direction movement unit may include a rotational movement unit which allows the pin support member to move rotationally relatively with respect to the spin base around the rotation axis.

According to the above-described configuration, the substrate holding/rotating device includes a spin base to which the rotation unit is connected and a pin support member which is disposed so as to rotate together with the spin base and also so as to move rotationally relatively with respect to the spin base. Each of the movable pins included in the first pin group is disposed so as to rotate together with the pin support member, and each of the movable pins included in the second pin group is disposed so as to rotate together with the spin base. Thereby, it is possible to realize a configuration (first circumferential direction movement unit) which moves in the circumferential direction the support portion of each of the movable pins included in the first pin group by a relatively simple configuration.

Further, where the support portion of each of the movable pins included in the second pin group is at the hold position and also the support portion of each of the movable pins included in the first pin group is at the open position, the substrate may be supported by each of the movable pins included in the second pin group. In this case, the substrate holding/rotating device may further include a second movement unit which moves the support portion of each of the movable pins included in the second pin group between the open position and the hold position, and a controller which controls the first movement unit and the second movement unit. In this case, the controller may execute a first circumferential direction movement step in which, in a state that each of the movable pins included in the first pin group is at the hold position and also each of the movable pins included in the second pin group is at the open position, the support portion of each of the movable pins included in the first pin group is moved in the circumferential direction by the first movement unit from the first hold position to the second hold position, and a first movement step in which, after completion of the first circumferential direction movement step, the support portion of each of the movable pins included in the second pin group is moved by the second movement unit from the open position to the hold position.

According to the above-described configuration, in a state that the support portion of each of the movable pins included in the first pin group is at the hold position and also the support portion of each of the movable pins included in the second pin group is at the open position, the substrate is supported by each of the movable pins included in the first pin group. In this state, the support portion of each of the movable pins included in the first pin group is moved in the circumferential direction from the first hold position to the second hold position, by which the substrate moves rotationally around the rotation axis in association with movement of the support portion. Further, after the support portion of each of the movable pins included in the first pin group has reached the second hold position, the support portion of each of the movable pins included in the second pin group is moved from the open position to the hold position. As a result, the substrate is held not only by each of the movable pins included in the first pin group but also by each of the movable pins included in the second pin group. That is, while the substrate is supported only by each of the movable pins included in the first pin group, each of the movable pins is moved in the circumferential direction, by which the substrate is allowed to move rotationally around the rotation axis. Thereby, the substrate can be changed in contact support position at the peripheral edge portion thereof, while the substrate is satisfactorily held horizontally.

The controller may further execute a second movement step in which, after completion of the first movement step, the first movement unit is controlled to move the support portion of each of the movable pins included in the first pin group from the second hold position to the open position, and a third movement step in which, after the second movement step, the first movement unit is controlled to move the support portion of each of the movable pins included in the first pin group from the open position to the first hold position.

According to the above-described configuration, after the support portion of each of the movable pins included in the second pin group has been moved to the hold position, the support portion of each of the movable pins included in the first pin group is moved from the second hold position to the open position and, thereafter, the support portion of each of the movable pins included in the first pin group is moved from the open position to the first hold position. Thereby, the support portion of each of the movable pins included in the first pin group which has been moved to the second hold position by the first circumferential direction movement step can be returned to the first hold position.

The controller may further execute a fourth movement step in which, in a state that the support portion of each of the movable pins included in the first pin group and that in the second pin group have been arranged at the hold position, prior to start of the first circumferential direction movement step, the first movement unit is controlled to move the support portion of each of the movable pins included in the second pin group from the hold position to the open position.

According to the above-described configuration, prior to start of the first circumferential direction movement step, in a state that the support portion of each of the movable pins included in the first pin group and that in the second pin group have been arranged at the hold position, the support portion of each of the movable pins included in the second pin group is moved from the hold position to the open position. It is, thereby, possible to realize a state that the support portion of each of the movable pins included in the first pin group is at the hold position and also the support portion of each of the movable pins included in the second pin group is at the open position. And, with this state retained, it is possible to start execution of the first circumferential direction movement step.

The controller may further execute a rotation process in which the rotation unit is controlled to rotate the plurality of movable pins around the rotation axis, and the controller may execute the first circumferential direction movement step and the first movement step, in parallel with the rotation process.

According to the above-described configuration, in a state that each of the movable pins included in the first pin group and each of the movable pins included in the second pin group are rotating, the support portion of each of the movable pins included in the first pin group is at the hold position and the support portion of each of the movable pins included in the second pin group is at the open position, the support portion of each of the movable pins included in the first pin group is moved in the circumferential direction from the first hold position to the second hold position. Further, after the support portion of each of the movable pins included in the first pin group has reached the second hold position, the support portion of each of the movable pins included in the second pin group is moved from the open position to the hold position. Thereby, the substrate can be changed in contact support position at the peripheral edge portion thereof, while the substrate is rotated.

Further, the support portion of each of the movable pins included in the second pin group is disposed so as to move between a predetermined third hold position included the hold positions, and a fourth hold position which is far apart from the third hold position to one in the circumferential direction, included the hold positions, and also so as to move between the third and fourth hold positions and the open position. The substrate holding/rotating device further includes a third movement unit which moves the support portion of each of the movable pins included in the second pin group between the third hold position and the fourth hold position, with the hold position retained, and a fourth movement unit which moves the support portion of each of the movable pins included in the first pin group between the open position and the hold position. The controller may further execute a second movement step in which, after completion of the first movement step, the fourth movement unit is controlled to move the support portion of each of the movable pins included in the first pin group from the second hold position to the open position, a second circumferential direction movement step in which, after the second movement step, the third movement unit is controlled to move in the circumferential direction the support portion of each of the movable pins included in the second pin group from the third hold position to the fourth hold position, and a third movement step in which, after completion of the second circumferential direction movement step, the first movement unit is controlled to move the support portion of each of the movable pins included in the first pin group from the open position to the first hold position.

According to the above-described configuration, after completion of the first movement step, the support portion of each of the movable pins included in the first pin group is moved from the second hold position to the open position. Thereby, there develops such a state that the support portion of each of the movable pins included in the second pin group is at the hold position and the support portion of each of the movable pins included in the first pin group is at the open position. In this state, the substrate is supported by each of the movable pins included in the second pin group. With this state retained, the support portion of each of the movable pins included in the second pin group is moved in the circumferential direction from the third hold position to the fourth hold position, by which, in association with movement of the support portion, the substrate moves rotationally around the rotation axis. Further, after the support portion of each of the movable pins included in the second pin group has reached the fourth hold position, the support portion of each of the movable pins included in the first pin group is moved from the open position to the hold position. As a result, the substrate is held not only by each of the movable pins included in the second pin group but also by each of the movable pins in the first pin group. That is, while the substrate is supported only by each of the movable pins included in the second pin group, each of these movable pins is moved in the circumferential direction, by which the substrate is allowed to move rotationally around the rotation axis. Thereby, the substrate can be changed in contact support position at the peripheral edge portion, while the substrate is satisfactorily held horizontally. Therefore, the substrate is allowed to move rotationally in two stages by a series of alternately holding motions. As a result, the substrate can be significantly changed in contact support position at the peripheral edge portion thereof.

Further, the second movement unit may include a first annular magnet which is formed in a circular annular shape around the rotation axis, a first switching mechanism which has a first driving magnet disposed so as to rotate together with each of the movable pins included in the first pin group and switches the support portion of each of the movable pins included in the first pin group between the hold position and the open position, a first elevated/lowered magnet which opposes the lower side of the first annular magnet and has a magnetic pole direction which imparts a repulsive force or an attractive force in relation to the first driving magnet, and a first elevating/lowering unit which elevates and lowers the first elevated/lowered magnet between an upper position at which the first elevated/lowered magnet imparts the repulsive force or the attractive force in relation to the first driving magnet and a lower position at which the repulsive force or the attractive force imparted by the first elevated/lowered magnet in relation to the first driving magnet is smaller than that at the upper position. In this case, the fourth movement unit may include a second annular magnet which is formed in a circular annular shape around the rotation axis, a second switching mechanism which has a second driving magnet disposed so as to rotate together with each of the movable pins included in the second pin group and switches the support portion of each of the movable pins included in the second pin group between the hold position and the open position, a second elevated/lowered magnet which opposes the lower side of the second annular magnet and has a magnetic pole direction which imparts a repulsive force or an attractive force in relation to the second annular magnet, and a second elevating/lowering unit which elevates and lowers the second elevated/lowered magnet between an upper position at which the second elevated/lowered magnet imparts the repulsive force or the attractive force in relation to the second driving magnet and a lower position at which the repulsive force or the attractive force imparted by the second elevated/lowered magnet in relation to the second driving magnet is smaller than that at the upper position.

According to the above-described configuration, the first annular magnet can be elevated and lowered by elevating and lowering of the first elevated/lowered magnet. The support portion of each of the movable pins included in the first pin group can be moved between the hold position and the open position by elevating and lowering of the first annular magnet.

Further, the second annular magnet can be elevated and lowered by elevating and lowering of the second elevated/lowered magnet. The support portion of each of the movable pins included in the second pin group can be moved between the hold position and the open position by elevating and lowering of the second annular magnet.

Then, since the first annular magnet and the second annular magnet are each formed in a circular annular shape, the support portion of each of the movable pins included in the first pin group can be moved between the hold position and the open position, while the substrate is rotated. Since the second annular magnet is formed in a circular annular shape, the support portion of each of the movable pins included in the second pin group can be moved between the hold position and the open position while the substrate is rotated.

Further, the second movement unit may include a first urging unit which urges the support portion of each of the movable pins included in the first pin group to one of the open position and the hold position, a first driving magnet which is disposed so as to rotate together with each of the movable pins included in the first pin group and has a mutually equal magnetic pole direction, a third elevated/lowered magnet which has a magnetic pole direction that imparts a repulsive force or an attractive force in relation to the first driving magnet in a direction orthogonal to an axis along the rotation axis, thereby urging the support portion in the first movable pin group to the other of the open position and the hold position by the repulsive force or the attractive force, and a first elevating/lowering movement unit which elevates and lowers the third elevated/lowered magnet between an upper position at which the third elevated/lowered magnet imparts the repulsive force or the attractive force in relation to the first driving magnet and a lower position at which the repulsive force or the attractive force imparted by the third elevated/lowered magnet in relation to the first driving magnet is smaller than that at the upper position. In this case, the fourth movement unit may include a second urging unit which urges the support portion of each of the movable pins included in the second pin group to one of the open position and the hold position, a second driving magnet which is disposed so as to rotate together with each of the movable pins included in the second pin group and has a mutually equal magnetic pole direction which is opposite that of the first driving magnet, a fourth elevated/lowered magnet which has a magnetic pole direction that imparts a repulsive force or an attractive force in relation to the second driving magnet in a direction orthogonal to an axis along the rotation axis, thereby urging the support portion in the second movable pin group to the other of the open position and the hold position by the repulsive force or the attractive force, and a second elevating/lowering movement unit which elevates and lowers the fourth elevated/lowered magnet between an upper position at which the fourth elevated/lowered magnet imparts the repulsive force or the attractive force in relation to the first driving magnet and a lower position at which the repulsive force or the attractive force imparted by the fourth elevated/lowered magnet in relation to the first driving magnet is smaller than that at the upper position.

According to the above-described configuration, the first driving magnet is allowed to move rotationally around an axis along the rotation axis by elevating and lowering of the third elevated/lowered magnet. Therefore, the support portion of each of the movable pins included in the first pin group can be moved between the hold position and the open position by elevating and lowering of the third elevated/lowered magnet. Since the first driving magnet has a magnetic pole direction which is opposite that of the first driving magnet, it is possible to move the support portion of each of the movable pins included in the first pin group without moving the support portion of each of the movable pins included in the second pin group.

Further, the first driving magnet is allowed to move rotationally around an axis along the rotation axis by elevating and lowering of the fourth elevated/lowered magnet. Therefore, a support portion of each of movable pins included in a fourth pin group can be moved between the hold position and the open position by elevating and lowering of the fourth elevated/lowered magnet. Since the first driving magnet has a magnetic pole direction which is opposite that of the first driving magnet, it is possible to move the support portion of each of the movable pins included in the second pin group, without moving the support portion of each of the movable pins included in the first pin group.

Further, the third elevated/lowered magnets and the fourth elevated/lowered magnets are both disposed in the same plural numbers. The plurality of third elevated/lowered magnets and the plurality of fourth elevated/lowered magnets may be arranged alternately in a rotation direction of the substrate so as to form a circular annular shape which is coaxial to the rotation axis as a whole.

According to the above-described configuration, the plurality of third elevated/lowered magnets and the plurality of fourth elevated/lowered magnets are arranged alternately in the rotation direction of the substrate. Further, the plurality of third elevated/lowered magnets and the plurality of fourth elevated/lowered magnets are arranged so as to form a circular annular shape coaxial to the rotation axis as a whole. In this case, with attention given to an individual elevated/lowered magnet (a third elevated/lowered magnet or a fourth movement magnet), the elevated/lowered magnet is arranged intermittently on a circumference coaxial to the rotation axis in the rotation direction of the substrate. In this case as well, depending on a rotation speed of a rotating base and/or depending on a circumferential direction length of each of the elevated/lowered magnets, a magnetic field generation region can be disposed in a circular annular shape. Therefore, the support portion of each of the movable pins included in the first pin group can be moved between the hold position and the open position, while the substrate is rotated. And, the support portion of each of the movable pins included in the second pin group can also be moved between the hold position and the open position, while the substrate is rotated.

Further, the third movement unit may include a second circumferential direction movement unit which moves the support portion of each of the movable pins included in the second pin group between a third circumferential direction position and a fourth circumferential direction position far apart from the third circumferential direction position to one in the circumferential direction. In this case, the third hold position may be the hold position of the support portion when each of the movable pins included in the second pin group is at the third circumferential direction position, and the fourth hold position may be the hold position of the support portion when each of the movable pins included in the second pin group is at the fourth circumferential direction position.

According to the above-described configuration, each of the movable pins included in the second pin group is moved between the third circumferential direction position and the fourth circumferential direction position far apart from the third circumferential direction position to one in the circumferential direction. The hold position of the support portion of each of the movable pins included in the second pin group when it is at the third circumferential direction position is given as a third hold position and also the hold position of the support portion of each of the movable pins included in the second pin group when being at the fourth circumferential direction position is given as a fourth hold position. Thereby, it is possible to realize a configuration in which the support portion of each of the movable pins included in the second pin group is disposed so as to move between the third hold position and the fourth hold position by a relatively simple configuration.

The substrate holding/rotating device may further include a spin base to which the rotation unit is connected, a first pin support member which is disposed so as to rotate together with the spin base and also so as to move rotationally relatively with respect to the spin base, thereby supporting each of the movable pins included in the first pin group, and a second pin support member which is disposed so as to rotate together with the spin base and also so as to move rotationally relatively with respect to the spin base and which is a member different from the first pin support member and supports each of the movable pins included in the second pin group. The first movement unit includes a first circumferential direction movement unit which moves each of the movable pins included in the first pin group between a first circumferential direction position and a second circumferential direction position far apart from the first circumferential direction position to one in the circumferential direction. The first hold position is the hold position of the support portion when each of the movable pins included in the first pin group is at the first circumferential direction position, and the second hold position is the hold position of the support portion when each of the movable pins included in the first pin group is at the second circumferential direction position. In this case, the first circumferential direction movement unit may include one of the first rotational movement unit which allows the first pin support member to move rotationally relatively with respect to the spin base around the rotation axis and the second rotational movement unit which allows the second pin support member to move rotationally relatively with respect to the spin base around the rotation axis. Also, the second circumferential direction movement unit may include the other of the first rotational movement unit and the second rotational movement unit.

According to the above-described configuration, the substrate holding/rotating device includes a spin base to which the rotation unit is connected, a first pin support member which is disposed so as to rotate together with the spin base and a second pin support member which is disposed so as to rotate together with the spin base. Further, the first pin support member and the second pin support member are disposed so as to move rotationally relatively with respect to the spin base. Still further, each of the movable pins included in one of the first pin group and the second pin group is disposed so as to rotate together with the first pin support member, and each of the movable pins included in the other of the first pin group and the second pin group is disposed so as to rotate together with the second pin support member. Thereby, a configuration (first circumferential direction movement unit) in which the support portion of each of the movable pins included in the first pin group and the support portion of each of the movable pins included in the second pin group are independently moved in the circumferential direction with respect to the spin base and the support portion of each of the movable pins included in the first pin group is moved in the circumferential direction, and also a configuration (second circumferential direction movement unit) in which the support portion of each of the movable pins included in the second pin group is moved in the circumferential direction can be realized individually by a relatively simple configuration.

The present invention provides a substrate processing apparatus which includes a substrate holding/rotating device which rotates a substrate around a predetermined rotation axis extending along a vertical direction, while holding the substrate horizontally, the substrate holding/rotating device which includes a plurality of movable pins arranged along the circumference at the center of the rotation axis, that is, the movable pins each having a support portion in contact with a peripheral edge portion of the substrate to support the substrate and a rotation unit which rotates the plurality of movable pins around the rotation axis, in which the plurality of movable pins include a first pin group which includes at least three movable pins and a second pin group which includes at least three movable pins, the support portion of each of the movable pins included in the first pin group is disposed so as to move between a first hold position included in a hold position or a predetermined first hold position close to the rotation axis and a second hold position included in the hold position or a second hold position far apart from the first hold position to one in the circumferential direction and also so as to move between the first and second hold positions and an open position far apart from the rotation axis, the support portion of each of the movable pins included in the second pin group is disposed so as to move between the hold position close to the rotation axis and the open position far apart from the rotation axis, where the support portion of each of the movable pins included in the first pin group is at the hold position and also the support portion of each of the movable pins included in the second pin group is at the open position, the substrate can be supported by each of the movable pins included in the first pin group, and the substrate holding/rotating device which further includes a first movement unit which moves in the circumferential direction the support portion of each of the movable pins included in the first pin group between the first hold position and the second hold position, with the hold position retained, and a processing liquid supplying unit which supplies a processing liquid to a principal surface of the substrate held by the substrate holding/rotating device.

According to the above-described configuration, a processing liquid is supplied to a principal surface of the substrate held by the substrate holding/rotating device, by which the processing liquid is used to process the principal surface of the substrate. Where the substrate holding/rotating device is in such a state that the support portion of each of the movable pins included in the first pin group is at the hold position and each of the movable pins included in the second pin group is at the open position, the substrate is supported by each of the movable pins included in the first pin group. With this state retained, the support portion of each of the movable pins included in the first pin group is moved in the circumferential direction from the first hold position to the second hold position, by which, in association with movement of the support portion, the substrate moves rotationally around the rotation axis. Further, after the support portion of each of the movable pins included in the first pin group has reached the second hold position, the support portion of each of the movable pins included in the second pin group is moved from the open position to the hold position. As a result, the substrate is to be supported not only by each of the movable pins included in the first pin group but also by each of the movable pins included in the second pin group. Thereby, the substrate can be changed in contact support position at the peripheral edge portion thereof, while the substrate is satisfactorily held horizontally.

One preferred embodiment of the present invention further includes a controller which controls the rotation unit and the processing liquid supplying unit, and the controller executes a processing step by processing liquid in which a processing liquid is supplied to a principal surface of the substrate by the processing liquid supplying unit to process the substrate, while the substrate held by the substrate holding/rotating device is rotated around the rotation axis by the rotation unit.

According to the above-described configuration, a processing liquid is supplied to a principal surface of the substrate held by the substrate holding/rotating device, by which the processing liquid is used to process the principal surface of the substrate. In the previously described substrate holding/rotating device, the substrate can be changed in contact support position at the peripheral edge portion thereof, while the substrate is satisfactorily held horizontally. Thereby, it is possible to satisfactorily process an entire surface of the peripheral edge portion of the substrate.

Further, where the support portion of each of the movable pins included in the second pin group is at the hold position and also the support portion of each of the movable pins included in the first pin group is at the open position, the substrate can be supported by each of the movable pins included in the second pin group. The substrate holding/rotating device further includes a second movement unit in which the support portion of each of the movable pins included in the second pin group is moved between the open position and the hold position. The controller further controls the first movement unit and the second movement unit, and the controller may execute a first circumferential direction movement step in which, in a state that each of the movable pins included in the first pin group is at the hold position and each of the movable pins included in the second pin group is at the open position, the support portion of each of the movable pins included in the first pin group is moved in the circumferential direction from the first hold position to the second hold position by the first movement unit, and a first movement step in which, after completion of the first circumferential direction movement step, the support portion of each of the movable pins included in the second pin group is moved from the open position to the hold position by the second movement unit, in parallel with the processing step by processing liquid.

According to the above-described configuration, in a state that each of the movable pins included in the first pin group and each of the movable pins included in the second pin group are rotating and also each of the movable pins included in the first pin group is at the hold position and each of the movable pins included in the second pin group is at the open position, the support portion of each of the movable pins included in the first pin group is moved in the circumferential direction from the first hold position to the second hold position. Further, after the support portion of each of the movable pins included in the first pin group has reached the second hold position, the support portion of each of the movable pins included in the second pin group is moved from the open position to the hold position. Thereby, the substrate can be changed in contact support position at the peripheral edge portion thereof, while the substrate is rotated.

The present invention provides a substrate processing method which is executed by a substrate processing apparatus which includes a substrate holding/rotating device which rotates a substrate around a predetermined rotation axis extending along a vertical direction, while holding the substrate horizontally, the substrate holding/rotating device which includes a plurality of movable pins arranged along a circumference at the center of a predetermined rotation axis extending along a vertical direction, that is, the movable pins each having a support portion in contact with a peripheral edge portion of the substrate to support the substrate, in which the plurality of movable pins include a first pin group which includes at least three movable pins and a second pin group which includes at least three movable pins, where the support portion of each of the movable pins included in the first pin group is at the hold position and the support portion of each of the movable pins included in the second pin group is at the open position, the substrate can be supported by each of the movable pins included in the first pin group, and where the support portion of each of the movable pins included in the second pin group is at the hold position and the support portion of each of the movable pins included in the first pin group is at the open position, the substrate can be supported by each of the movable pins included in the second pin group, the substrate processing method which includes a substrate holding step in which the substrate is held by the substrate holding/rotating device in a horizontal posture, a processing step by processing liquid in which a processing liquid is supplied to a principal surface of the substrate to process the substrate, while the substrate held by the substrate holding/rotating device is rotated around the rotation axis, a first circumferential direction movement step in which the support portion of each of the movable pins included in the first pin group is moved in the circumferential direction from a predetermined first hold position included hold positions, the first hold position close to the rotation axis to a predetermined second hold position included the hold positions, the second hold position close to the rotation axis and far apart the first hold position to one in the circumferential direction, and also so as to move between the first and second hold positions and an open position far apart the rotation axis, and a first movement step in which, after completion of the first circumferential direction movement step, the support portion of each of the movable pins included in the second pin group is moved from the open position to the hold position.

According to the above-described method, a processing liquid is supplied to a principal surface of the substrate held by the substrate holding/rotating device, by which the processing liquid is used to process the principal surface of the substrate. Where the substrate holding/rotating device is in such a state that the support portion of each of the movable pins included in the first pin group is at the hold position and the support portion of each of the movable pins included in the second pin group is at the open position, the substrate is supported by each of the movable pins included in the first pin group. With this state retained, the support portion of each of the movable pins included in the first pin group is moved in the circumferential direction from the first hold position to the second hold position, by which the substrate moves rotationally around the rotation axis in association with movement of the support portion. Further, after the support portion of each of the movable pins included in the first pin group has reached the second hold position, the support portion of each of the movable pins included in the second pin group is moved from the open position to the hold position. As a result, the substrate is held not only by each of the movable pins included in the first pin group but also by each of the movable pins included in the second pin group. That is, while the substrate is supported only by each of the movable pins included in the first pin group, each of these movable pins is moved in the circumferential direction, by which the substrate is allowed to move rotationally around the rotation axis. Thereby, the substrate can be changed in contact support position at the peripheral edge portion thereof, while the substrate is satisfactorily held horizontally.

The substrate processing method may further include a second movement step in which, after completion of the first movement step, the support portion of each of the movable pins included in the first pin group is moved from the second hold position to the open position, and a third movement step in which, after the second movement step, the support portion of each of the movable pins included in the first pin group is moved from the open position to the first hold position.

According to the above-described method, after the support portion of each of the movable pins included in the second pin group has been moved to the hold position, the support portion of each of the movable pins included in the first pin group is moved from the second hold position to the open position and, thereafter, the support portion of each of the movable pins included in the first pin group is moved from the open position to the first hold position. Thereby, the support portion of each of the movable pins included in the first pin group which has been moved by the first circumferential direction movement step to the second hold position can be returned to the first hold position.

The substrate processing method may further include a fourth movement step in which, in a state that the support portion of each of the movable pins included in the first pin group and that in the second pin group are arranged at the hold position, prior to start of the first circumferential direction movement step, the support portion of each of the movable pins included in the second pin group is moved from the hold position to the open position.

According to the above-described method, prior to start of the first circumferential direction movement step, in a state that the support portion of each of the movable pins included in the first pin group and that in the second pin group are arranged at the hold position, the support portion of each of the movable pins included in the second pin group is moved from the hold position to the open position. Thereby, there can develop such a state that each of the movable pins included in the first pin group is at the hold position and each of the movable pins included in the second pin group is at the open position. And, with this state retained, it is possible to start execution of the first circumferential direction movement step.

In the substrate holding/rotating device, the support portion of each of the movable pins included in the second pin group is disposed so as to move between a predetermined third hold position included the hold positions, and a fourth hold position far apart from the third hold position to one in the circumferential direction, included the hold positions, and also so as to move between the third and fourth hold positions and the open position. The substrate processing method may further include a second movement step in which, after completion of the first movement step, the support portion of each of the movable pins included in the first pin group is moved from the second hold position to the open position, a second circumferential direction movement step in which, after the second movement step, the support portion of each of the movable pins included in the second pin group is moved in the circumferential direction from the third hold position to the fourth hold position, and a third movement step in which, after completion of the second circumferential direction movement step, the support portion of each of the movable pins included in the first pin group is moved from the open position to the first hold position.

According to the above-described method, after completion of the first movement step, the support portion of each of the movable pins included in the first pin group is moved from the second hold position to the open position. Thereby, there develops a state that the support portion of each of the movable pins included in the second pin group is at the hold position and the support portion of each of the movable pins included in the first pin group is at the open position. In this state, the substrate is supported by each of the movable pins included in the second pin group. With this state retained, the support portion of each of the movable pins included in the second pin group is moved in the circumferential direction from the third hold position to the fourth hold position, by which, in association with movement of the support portion, the substrate moves rotationally around the rotation axis. Further, after the support portion of each of the movable pins included in the second pin group has reached the fourth hold position, the support portion of each of the movable pins included in the first pin group is moved from the open position to the hold position. As a result, the substrate is held not only by each of the movable pins included in the second pin group but also by each of the movable pins included in the first pin group. That is, while the substrate is supported only by each of the movable pins included in the second pin group, each of these movable pins is moved in the circumferential direction, by which the substrate is allowed to move rotationally around the rotation axis. Thereby, the substrate can be changed in contact support position at the peripheral edge portion thereof, while the substrate is satisfactorily held horizontally. Therefore, the substrate is allowed to move rotationally in two stages by a series of alternately holding motions. And, the substrate can be significantly changed in contact support position at the peripheral edge portion thereof.

The first circumferential direction movement step and the first movement step may be executed in parallel with the processing step by processing liquid.

According to the above-described method, in a state that each of the movable pins included in the first pin group and each of the movable pins included in the second pin group are rotating, the support portion of each of the movable pins included in the first pin group is at the hold position and the support portion of each of the movable pins included in the second pin group is at the open position, the support portion of each of the movable pins included in the first pin group is moved in the circumferential direction from the first hold position to the second hold position. Further, after the support portion of each of the movable pins included in the first pin group has reached the second hold position, the support portion of each of the movable pins included in the second pin group is moved from the open position to the hold position. Thereby, the substrate can be changed in contact support position at the peripheral edge portion thereof, while the substrate is rotated.

The aforementioned and other objects, features and effects of the present invention will be clarified by the following description of preferred embodiments with reference to the attached drawings.

BRIEF DESCRIPTION OF THE DRAWINGS

FIG. 4 is a plan view for describing a more specific configuration of the spin chuck.

FIGS. 5A and 5B are each an enlarged cross sectional view which shows a configuration in the vicinity of a first movable pin.

FIGS. 6A and 6B are each an enlarged cross sectional view which shows a configuration in the vicinity of a second movable pin.

FIGS. 10A to 10F are each a schematic plan view for describing motions of a substrate rotational movement step.

FIGS. 11A to 11F are each a schematic plan view for describing motions of a substrate rotational movement step according to a second preferred embodiment of the present invention.

FIGS. 14A and 14B are each an enlarged cross sectional view which shows a configuration in the vicinity of a first movable pin.

FIGS. 15A, 15B are each an enlarged cross sectional view which shows a configuration in the vicinity of the second movable pin. FIG. 15A shows a state in which the second support portion is at a hold position.

FIGS. 16A to 16C are each a schematic diagram which shows a state of a first movable pin and that of a second movable pin.

FIGS. 17A to 17C are each a schematic diagram which shows a state of the first movable pin and that of the second movable pin.

DETAILED DESCRIPTION OF PREFERRED EMBODIMENT

Hereinafter, embodiments of the present invention will be described in detail by referring to the attached drawings.

Figure 1:
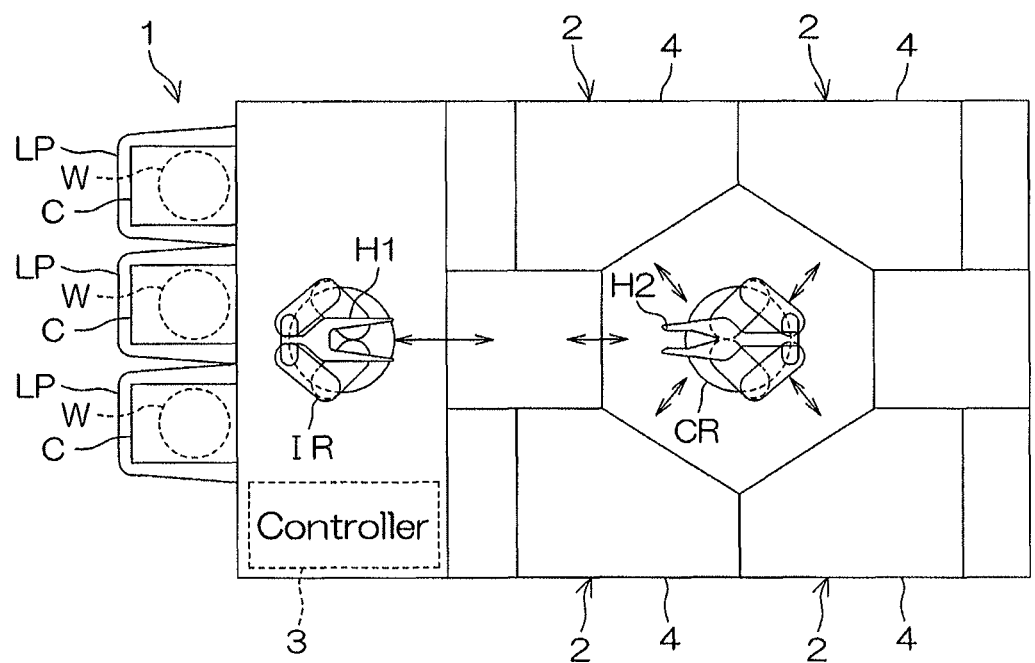
FIG. 1 is a plan view for describing an internal layout of a substrate processing apparatus according to a first preferred embodiment of the present invention.

FIG. 1 is an illustrative plan view for describing an internal layout of a substrate processing apparatus 1 according to a first preferred embodiment of the present invention.

The substrate processing apparatus 1 is a single substrate processing type apparatus which processes circular-plate shaped substrates W such as semiconductor wafers one at a time by using a processing liquid or a processing gas. The substrate processing apparatus 1 includes a plurality of processing units 2 which process a substrate W by using a processing liquid, a load port LP at which a carrier C for housing plural sheets of the substrates W processed by the processing units 2 is placed, a transfer robot IR and a transfer robot CR, each of which transfers a substrate W between the load port LP and the processing unit 2, and a controller 3 for controlling the substrate processing apparatus 1. The transfer robot IR transfers a substrate W by using a hand H1 between the carrier C and the substrate transfer robot CR. The substrate transfer robot CR transfers a substrate W by using a hand H2 between the transfer robot IR and the processing unit 2. The plurality of processing units 2 are mutually similar in configuration, for example.

Figure 2:
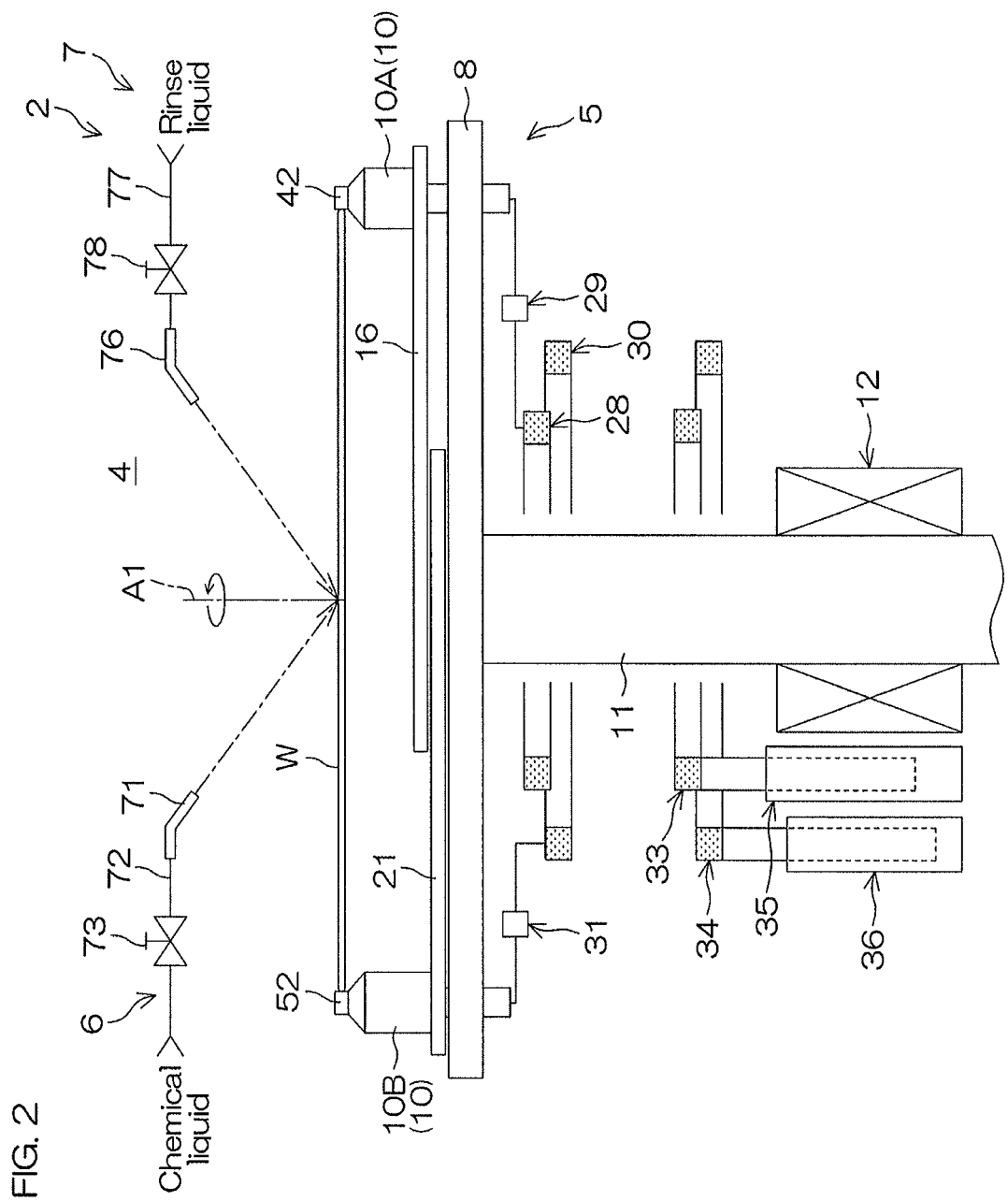
FIG. 2 is an illustrative cross sectional view for describing a configuration example of a processing unit provided in the substrate processing apparatus.

FIG. 2 is an illustrative cross sectional view for describing a configuration example of the processing unit 2. The processing unit 2 includes a box-shaped chamber 4 having an internal space, a spin chuck (substrate holding/rotating device) 5 which holds one sheet of a substrate W in a horizontal posture inside the chamber 4 to rotate the substrate W around a perpendicular rotation axis A1 passing through the center of the substrate W, a chemical liquid supplying unit (processing liquid supplying unit) 6 which supplies a chemical liquid to an upper surface of the substrate W held by the spin chuck 5, a rinse liquid supplying unit (processing liquid supplying unit) 7 which supplies a rinse liquid to the upper surface of the substrate W, and a cylindrical processing cup (not shown) which surrounds the spin chuck 5.

Figure 3:
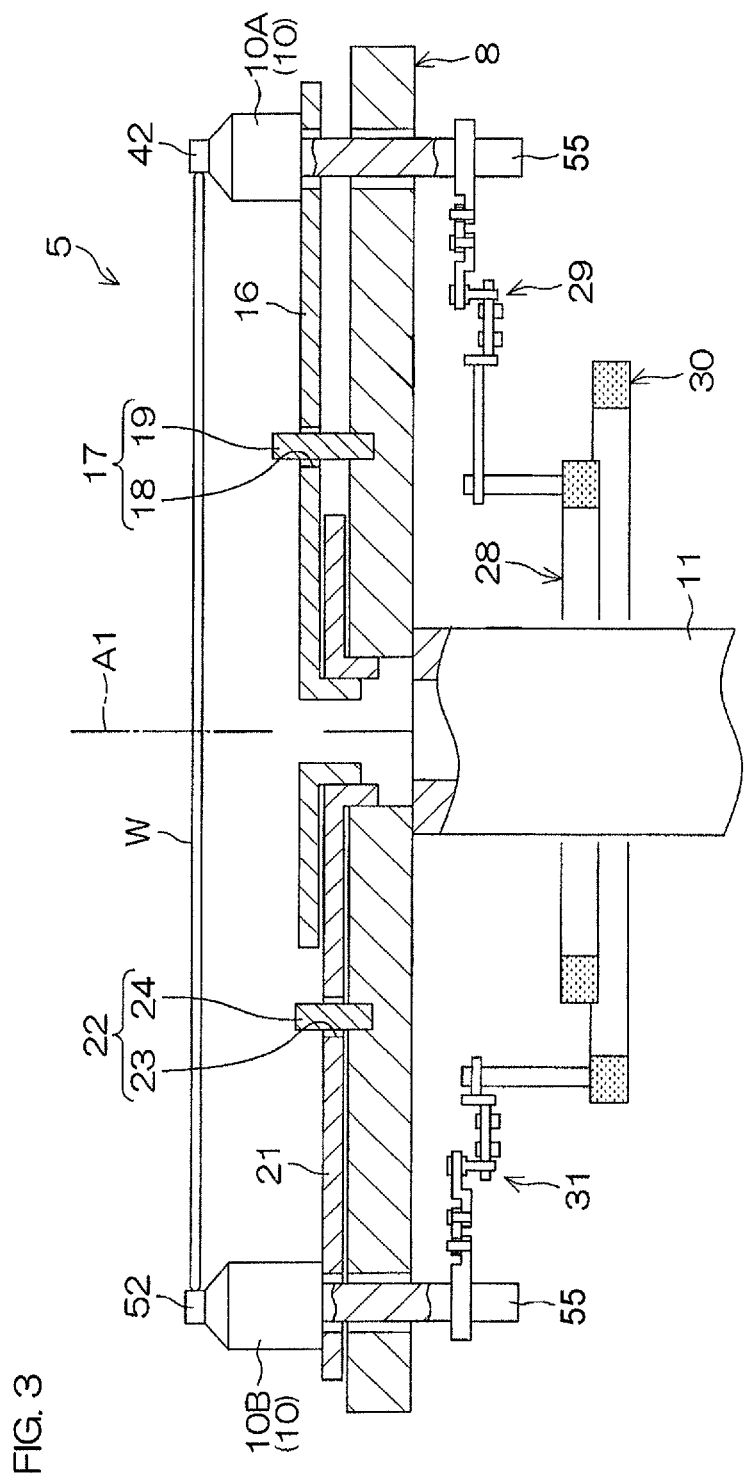
FIG. 3 is a side view for describing a more specific configuration of a spin chuck provided at the processing unit.

FIG. 3 is a side view for describing a more specific configuration of the spin chuck 5. FIG. 4 is a plan view for describing a more specific configuration of the spin chuck 5. FIGS. 5A and 5B are each an enlarged cross sectional view which shows a configuration in the vicinity of the first movable pin 10A. FIGS. 6A and 6B are each an enlarged cross sectional view which shows a configuration in the vicinity of the second movable pin 10B. FIG. 3 is a drawing taken along line III to III shown in FIG. 4.

As shown in FIG. 2 and FIG. 3, the spin chuck 5 includes a spin base 8 capable of rotating around the rotation axis A1 along a vertical direction, a plurality of (six in the preferred embodiment) movable pins 10 which are disposed at a peripheral edge portion of the upper surface of the spin base 8 along the circumferential direction, with a substantially equal interval retained, a rotation shaft 11 which is fixed at a rotation center on the lower surface of the spin base 8, and a spin motor (rotation unit) 12 which rotates the rotation shaft 11 around the rotation axis A1. Pins used for holding provided on the spin chuck 5 are all movable pins in which the support portions (first support portion 42 and second support portion 52) in contact with the peripheral edge portion of the substrate W are movable. The circumferential direction Y of the spin base 8 includes a first circumferential direction Y1 and a second circumferential direction Y2 which is opposite the first circumferential direction Y1.

As shown in FIG. 4, each of the movable pins 10 is arranged at a peripheral edge portion of the upper surface of the spin base 8 on a circumference at the center of the rotation axis A1, with a substantially equal interval retained. Six movable pins 10 are set so as to give three movable pins 10 which are not mutually adjacent each in one group opened and closed at the same time. In other words, the six movable pins 10 include three movable pins 10A included in a first pin group and three movable pins 10B included in a second pin group. Hereinafter, the movable pins included in the first pin group are referred to as first movable pins 10A, and the movable pins included in the second pin group are referred to as second movable pins 10B. The first movable pins 10A and the second movable pins 10B are arranged alternately in relation to the circumferential direction Y of the spin base 8. With attention given to the first pin group, the three first movable pins 10A are arranged at equal intervals (120° intervals). Further, with attention given to the second pin group, the three second movable pins 10B are arranged at equal intervals (120° intervals).

The three first movable pins 10A are disposed so as to move rotationally together with each other around the rotation axis A1 with respect to the spin base 8. Specifically, the spin chuck 5 further includes a first pin support member 16 which supports collectively three first movable pins 10A. The first pin support member 16 is a plate-shaped member which radially extends in three directions, with an equal interval retained, from a center arranged on the rotation axis A1. The first pin support member 16 is disposed so as to move rotationally around the rotation axis A1 with respect to the spin base 8. The spin chuck 5 is provided with a first rotational movement regulating structure 17 (not shown in FIG. 2, refer to FIG. 3 and FIG. 4) for regulating a rotational movement range of the first pin support member 16 for the spin base 8 to a predetermined angle range. The first rotational movement regulating structure 17 includes, for example, a first long hole 18 (not shown in FIG. 2, refer to FIG. 3 and FIG. 4) which is formed at the first pin support member 16 to extend in the circumferential direction Y and a first insertion pin 19 (not shown in FIG. 2, refer to FIG. 3 and FIG. 4) which is disposed upright on the spin base 8 to insert through the first long hole 18. The first insertion pin 19 is in contact with a circumferential end of the first long hole 18 to regulate rotational movement of the first pin support member 16. In the preferred embodiment, the rotational movement range of the first pin support member 16 with respect to the spin base 8 is several degrees (for example, about 5°).

The three second movable pins 10B are disposed so as to move rotationally around the rotation axis A1 together with each other with respect to the spin base 8. Specifically, the spin chuck 5 further includes a second pin support member 21 for supporting collectively the three second movable pins 10B. In the preferred embodiment, the second pin support member 21 is arranged between the spin base 8 and the first pin support member 16.

The second pin support member 21 is a plate-shaped member which radially extends in three directions, with an equal interval retained, from the center arranged on the rotation axis A1. In the preferred embodiment, the first pin support member 16 deviates from the second pin support member 21 at about 60° in terms of a phase around the rotation axis A1.

The second pin support member 21 is disposed so as to move rotationally around the rotation axis A1 with respect to the spin base 8. The spin chuck 5 is provided with a second rotational movement regulating structure 22 (not shown in FIG. 2, refer to FIG. 3 and FIG. 4) for regulating a rotational movement range of the second pin support member 21 with respect to the spin base 8 to a predetermined angle range. The second rotational movement regulating structure 22 includes, for example, a second long hole 23 (not shown in FIG. 2, refer to FIG. 3 and FIG. 4) which is formed on the second pin support member 21 to extend along the circumferential direction Y and a second insertion pin 24 (not shown in FIG. 2, refer to FIG. 3 and FIG. 4) which is disposed upright on the spin base 8 to insert through the second long hole 23. The second insertion pin 24 is in contact with a circumferential end of the second long hole 23 to regulate rotational movement of the second pin support member 21. In the preferred embodiment, the rotational movement range of the second pin support member 21 with respect to the spin base 8 is several degrees (for example, about 5°).

As shown in FIG. 2, the spin chuck 5 further includes a first rotational movement unit (first circumferential direction movement unit) 26 which allows the first pin support member 16 to move rotationally relatively around the rotation axis with respect to the spin base 8 and a second rotational movement unit (second circumferential direction movement unit) 27 which allows the second pin support member 21 to move rotationally relatively around the rotation axis with respect to the spin base 8. The first rotational movement unit 26 is joined to the first pin support member 16, and the second rotational movement unit 27 is joined to the second pin support member 21. The first rotational movement unit 26 and the second rotational movement unit 27 are each an electric motor, for example. The electric motor is disposed so as to rotate forwardly and reversely.

When the first rotational movement unit 26 rotates forward, the first pin support member 16 moves rotationally in a first circumferential direction (one in the circumferential direction) Y1 with respect to the spin base 8. Further, when the first rotational movement unit 26 rotates reversely, the first pin support member 16 moves rotationally in a second circumferential direction Y2 with respect to the spin base 8. The first rotational movement unit 26 is disposed so as to allow a position of the first pin support member 16 with respect to the spin base 8 to move rotationally between a first circumferential direction position P51 (refer to FIG. 7A) and a second circumferential direction position P52 (refer to FIG. 7A) which deviates in the first circumferential direction Y1 at a predetermined angle (several degrees (for example, about 5°)) from the first circumferential direction position.

When the second rotational movement unit 27 rotates forward, the second pin support member 21 moves rotationally in the first circumferential direction Y1 with respect to the spin base 8. Further, when the second rotational movement unit 27 rotates reversely, the second pin support member 21 moves rotationally in the second circumferential direction Y2 with respect to the spin base 8. The second rotational movement unit 27 is disposed so as to allow a position of the second pin support member 21 with respect to the spin base 8 to move rotationally between a third circumferential direction position P53 (refer to FIG. 7B) and a fourth circumferential direction position P54 (refer to FIG. 7B) which deviates in the first circumferential direction Y1 at a predetermined angle (several degrees (for example about 5°)) from the third circumferential direction position.

As shown in FIG. 2 and FIG. 3, a first opening/closing magnet (first annular magnet) 28 is disposed integrally at the first pin support member 16. The first opening/closing magnet 28 is a permanent magnet and formed in a circular annular shape around the rotation axis A1. A magnetic pole direction of the first opening/closing magnet 28 is a direction along a vertical direction. The first opening/closing magnet 28 is disposed so as to be elevated and lowered. A first link mechanism (first switching mechanism) 29 is disposed on a one-to-one basis at the three first movable pins 10A, and each of the first link mechanisms 29 is connected to the first opening/closing magnet 28. The first link mechanism 29 has a configuration which includes a link, a cam follower, etc. A first support portion 42 of the first movable pin 10A can be displaced between the hold position and the open position on the basis of elevating and lowering of the first opening/closing magnet 28.

As shown in FIG. 2 and FIG. 3, a second opening/closing magnet (second annular magnet) 30 is disposed integrally at the second pin support member 21. The second opening/closing magnet 30 is a permanent magnet and formed in a circular annular shape around the rotation axis A1. A magnetic pole direction of the second opening/closing magnet 30 is a direction along the vertical direction. The second opening/closing magnet 30 is disposed so as to be elevated and lowered. A second link mechanism (second switching mechanism) 31 is disposed on a one-to-one basis at the three second movable pins 10B, and each of the second link mechanisms 31 is connected to the second opening/closing magnet 30. The second link mechanism 31 has a configuration which includes a link, cam follower, etc. A second support portion 52 of the second movable pin 10B can be displaced between the hold position and the open position on the basis of elevating and lowering of the second opening/closing magnet 30. In the preferred embodiment, the second opening/closing magnet 30 is a large-diameter ring which surrounds an outer circumference of the first opening/closing magnet 28.

As shown in FIG. 2 and FIG. 3, the first elevated/lowered magnet 33 and the second elevated/lowered magnet 34 are disposed below the spin base 8.

The first elevated/lowered magnet 33 opposes the lower side of the first opening/closing magnet 28. The first elevated/lowered magnet 33 is a permanent magnet and formed in a circular annular shape around the rotation axis A1. A magnetic pole direction of the first elevated/lowered magnet 33 is a direction along the vertical direction, and the upper surface of the first elevated/lowered magnet 33 is similar in polarity to the lower surface of the first opening/closing magnet 28.

A first elevating/lowering unit (second movement unit) 35 for elevating and lowering the first elevated/lowered magnet 33 is joined to the first elevated/lowered magnet 33. The first elevating/lowering unit 35 has, for example, a configuration which includes a cylinder disposed so as to expand and contract in the vertical direction, and it is supported by the cylinder. Further, the first elevating/lowering unit 35 may be constituted by using an electric motor.

In the first preferred embodiment, the second movement unit is constituted with the first opening/closing magnet 28, the first link mechanism 29, the first elevated/lowered magnet 33 and the first elevating/lowering unit 35.

A second elevated/lowered magnet 34 opposes the lower side of the second opening/closing magnet 30. The second elevated/lowered magnet 34 is a permanent magnet and formed in a circular annular shape around the rotation axis A1. A magnetic pole direction of the second elevated/lowered magnet 34 is a direction along the vertical direction, and the upper surface of the second elevated/lowered magnet 34 is similar in polarity to the lower surface of the second opening/closing magnet 30.

A second elevating/lowering unit 36 for elevating and lowering the second elevated/lowered magnet 34 is joined to the second elevated/lowered magnet 34. The second elevating/lowering unit 36 has, for example, a configuration which includes a cylinder disposed so as to expand and contract in the vertical direction and supported by the cylinder. Further, the second elevating/lowering unit 36 may be constituted by using an electric motor.

In the first preferred embodiment, the fourth movement unit is constituted with the second opening/closing magnet 30, the second link mechanism 31, the second elevated/lowered magnet 34 and the second elevating/lowering unit 36.

As shown in FIGS. 5A and 5B, each of the first movable pins 10A includes a first shaft portion 1 which is joined to the first pin support member 16 and a first support portion 42 which is formed integrally at an upper end of the first shaft portion 41. The first shaft portion 41 and the first support portion 42 are each formed in a cylindrical shape. The first support portion 42 is disposed so as to be eccentric from a central axis of the first shaft portion 41. A front surface which connects an upper end of the first shaft portion 41 with a lower end of the first support portion 42 forms a first tapered surface 43 which lowers from the first support portion 42 toward a circumference surface of the first shaft portion 41.

As shown in FIGS. 5A and 5B, each of the first movable pins 10A is joined to the first pin support member 16 so that the first shaft portion 41 can rotate around a rotational movement axis A2 coaxial to the central axis thereof. In more detail, a first support shaft 45 supported by way of a first bearing 44 with respect to the first pin support member 16 is disposed at a lower end portion of the first shaft portion 41.

As shown in FIGS. 5A and 5B, the first movable pin 10A is provided with the first support portion 42 at a position eccentric from the rotational movement axis A2. That is, the central axis of the first support portion 42 deviates from the rotational movement axis A2. Therefore, the first support portion 42 is to be displaced by rotation of the first shaft portion 41 between an open position (position shown in FIG. 5B), the central axis of the first support portion 42 is far apart from the rotation axis A1 and a hold position (position shown in FIG. 5A), the central axis of the first support portion 42 is close to the rotation axis A1. In a state that the first movable pin 10A is at the open position, a predetermined gap is formed in relation to a peripheral edge surface of the substrate W.

FIG. 5A shows a state that the first elevated/lowered magnet 33 is at a lower position, and FIG. 5B shows a state that the first elevated/lowered magnet 33 is at an upper position. As shown in FIG. 5A, in a state that the first elevated/lowered magnet 33 is at the lower position, no magnetic force from the first elevated/lowered magnet 33 is applied to the first opening/closing magnet 28. Therefore, the first opening/closing magnet 28 is at the lower position. In a state that the first opening/closing magnet 28 is at the lower position, the first link mechanism 29 arranges the first support portion 42 of the first movable pin 10A at the hold position. Therefore, in a state that the first elevated/lowered magnet 33 is at the lower position, the first support portion 42 of the first movable pin 10A is arranged at the hold position.

The first elevated/lowered magnet 33 is elevated in a state shown in FIG. 5A and arranged at an upper position. The upper surface of the first elevated/lowered magnet 33 comes close to the first opening/closing magnet 28, by which a repulsive magnetic force occurs on the first opening/closing magnet 28, and the first opening/closing magnet 28 is arranged at an upper position. In a state that the first opening/closing magnet 28 is at the upper position, the first link mechanism 29 arranges the first support portion 42 of the first movable pin 10A at the open position. Therefore, in a state that the first elevated/lowered magnet 33 is at the lower position, the first support portion 42 of the first movable pin 10A is arranged at the open position.

As shown in FIGS. 6A and 6B, each of the second movable pins 10B includes a second shaft portion 51 which is joined to the second pin support member 21 and a second support portion 52 which is formed integrally at an upper end of the second shaft portion 51. The second shaft portion 51 and the second support portion 42re each formed in a cylindrical shape. The second support portion 52 is disposed to be eccentric from a central axis of the second shaft portion 51. A front surface which connects an upper end of the second shaft portion 51 with a lower end of the second support portion 51 forms a second tapered surface 53 which declines from the second support portion 52 toward a circumference surface of the second shaft portion 51.

As shown in FIGS. 6A and 6B, each of the second movable pins 10B is joined to the second pin support member 21 so that the second shaft portion 51 can rotate around a rotational movement axis A3 coaxial to the central axis. In more detail, a second support shaft 55 which is supported in relation to the second pin support member 21 via the second bearing 54 is disposed at a lower end portion of the second shaft portion 51.

As shown in FIGS. 6A and 6B, the second movable pin 10B is provided with a second support portion 42t a position eccentric from the rotational movement axis A3. That is, the central axis of the second support portion 52 deviates from the rotational movement axis A3. Therefore, the second support portion 52 is displaced by rotation of the second shaft portion 51 between an open position (position shown in FIG. 6B), the central axis of the second support portion 52 is far apart from the rotation axis A1 and a hold position (position shown in FIG. 6A), the central axis of the second support portion 42 comes close to the rotation axis A1. In a state that the second movable pin 10B is at the open position, a predetermined gap is formed in relation to a peripheral edge surface of the substrate W.

FIG. 6A shows a state that the second elevated/lowered magnet 34 is at the lower position and FIG. 6B shows a state that the second elevated/lowered magnet 34 is at the upper position. As shown in FIG. 6A, in a state that the second elevated/lowered magnet 34 is at the lower position, no magnetic force from the second elevated/lowered magnet 34 is applied to the second opening/closing magnet 30. Therefore, the second opening/closing magnet 30 is at the lower position. In a state that the second opening/closing magnet 30 is at the lower position, the second link mechanism 31 arranges the second support portion 52 of the second movable pin 10B at the hold position. Therefore, in a state that the second elevated/lowered magnet 34 is at the lower position, the second support portion 52 of the second movable pin 10B is arranged at the hold position.

The second elevated/lowered magnet 34 is elevated in a state shown in FIG. 6A and arranged at the upper position. The upper surface of the second elevated/lowered magnet 34 comes close to the second opening/closing magnet 30, by which a repulsive magnetic force occurs on the second opening/closing magnet 30 and the second opening/closing magnet 30 is arranged at the upper position. In a state that the second opening/closing magnet 30 is at the upper position, the second link mechanism 31 arranges the second support portion 52 of the second movable pin 10B at the open position. Therefore, in a state that the second elevated/lowered magnet 34 is at the lower position, the second support portion 52 of the second movable pin 10B is arranged at the open position.

Therefore, the spin chuck 5 according to the first preferred embodiment is able to open and close individually three first movable pins 10A and three second movable pin 10B, while the first movable pin 10A and the second movable pin 10B are rotating around the rotation axis A1.

Further, even where each of the first movable pins 10A is at any position with respect to the spin base 8 from the first circumferential direction position P51 (refer to FIG. 7A) to the second circumferential direction position P52 (refer to FIG. 7A), it is possible to open and close each of the first movable pins 10A. Still further, even where each of the second movable pins 10B is at any position with respect to the spin base 8 from the third circumferential direction position P53 (refer to FIG. 7B) to the fourth circumferential direction position P54 (refer to FIG. 7B), it is possible to open and close each of the second movable pins 10B.

Figure 7A:
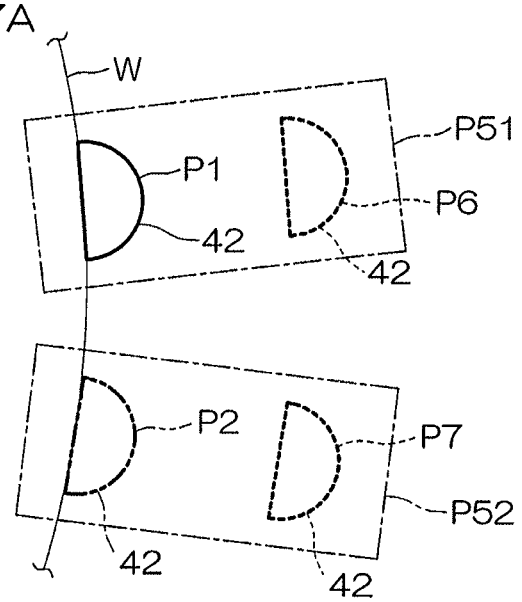
FIG. 7A is a plan view for describing a first hold position, a second hold position as well as a first open position and a second open position at a support portion of the first movable pin.

FIG. 7A is a plan view for describing a hold position and an open position of the first support portion 42.

When the first pin support member 16 is at the first circumferential direction position, the position of the first support portion 42 is defined as a first circumferential direction position P51. The hold position of the first support portion 42 in this state is referred to as a first hold position P1, whereas the open position of the first support portion 42 in this state is referred to as a first open position P6. Further, when the first pin support member 16 is at the second circumferential direction position, the position of the first support portion 42 is defined as a second circumferential direction position P52. The hold position of the first support portion 42 in this state is referred to as a second hold position P2, whereas the open position of the first support portion 42 in this state is referred to as a second open position P7.

Figure 7B:
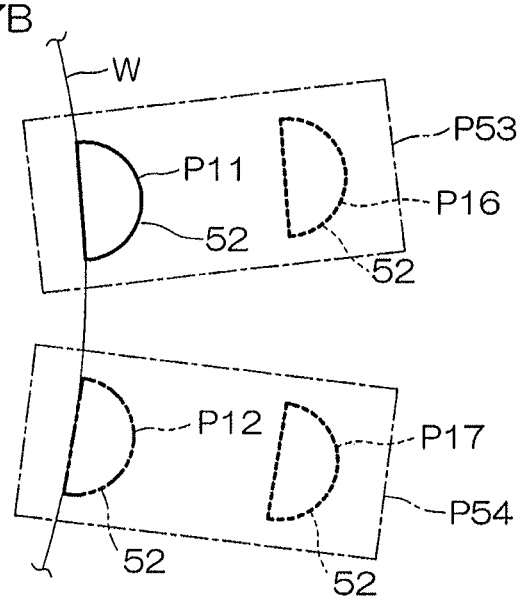
FIG. 7B is a plan view for describing a third hold position, a fourth hold position as well as a third open position and a fourth open position at a support portion of the second movable pin.

FIG. 7B is a plan view for describing a hold position and an open position of the second support portion 52.

When the second pin support member 21 is at the third circumferential direction position, the position of the second support portion 52 is defined as a third circumferential direction position P53. The hold position of the second support portion 52 in this state is referred to as a third hold position P11, whereas the open position of the second support portion 52 in this state is referred to as a third open position P16. Further, when the second pin support member 21 is at the fourth circumferential direction position, the position of the second support portion 52 is defined as a fourth circumferential direction position P54. The hold position of the second support portion 52 in this state is referred to as a fourth hold position P12, whereas the open position of the second support portion 52 in this state is referred to as a fourth open position P17.

As shown in FIG. 2, the chemical liquid supplying unit 6 includes a chemical liquid nozzle 71. The chemical liquid nozzle 71 is, for example, a straight nozzle that discharges a liquid in a continuous flow state and is arranged fixedly above the spin chuck 5, with a discharge port thereof directed at the vicinity of a rotation center of the upper surface of the substrate W. A chemical liquid piping 72 for supplying a chemical liquid from an etching liquid supply source is connected to the chemical liquid nozzle 71. A chemical liquid valve 73 for switching between supply and supply stoppage of an etching liquid from the chemical liquid nozzle 71 is placed on the chemical liquid piping 72. The chemical liquid supplied to the chemical liquid nozzle 71 is, for example, a liquid which includes at least one of sulfuric acid, acetic acid, nitric acid, hydrochloric acid, hydrofluoric acid, ammonia water, hydrogen peroxide water, an organic acid (for example, citric acid, oxalic acid, etc.), an organic alkali (for example, TMAH: tetramethylammonium hydroxide, etc.), a hydrophobic agent (for example, TMS, HMD, etc.), an organic solvent (for example, IPA: isopropyl alcohol, etc.), a surfactant, and a corrosion inhibitor. The chemical liquid supplying unit 6 may be provided with a chemical liquid nozzle movement device in which the chemical liquid nozzle 71 is moved to scan within a plane of the substrate W a position at which the chemical liquid is placed on the upper surface of the substrate W.

As shown in FIG. 2, the rinse liquid supplying unit 7 includes a rinse liquid nozzle 76. The rinse liquid nozzle 76 is, for example, a straight nozzle that discharges a liquid in a continuous flow state and is arranged fixedly above the spin chuck 5, with a discharge port thereof directed at the vicinity of a rotation center of the upper surface of the substrate W. A rinse liquid piping 77 for supplying a rinse liquid from a rinse liquid supply source is connected to the rinse liquid nozzle 76. A rinse liquid valve 78 for switching between supply and supply stoppage of the rinse liquid from the rinse liquid nozzle 76 is placed on the rinse liquid piping 77. Water supplied to the rinse liquid nozzle 76 is, for example, DIW (deionized water) and may include carbonated water, electrolyzed ion water, hydrogen water, ozone water, aqueous hydrochloric acid solution of dilute concentration (for example of approximately 10 ppm to 100 ppm), reduction water (hydrogen water), degassed water, etc. The rinse liquid supplying unit 7 may be provided with a rinse liquid nozzle movement device in which the rinse liquid nozzle 76 is moved to scan within the plane of the substrate W a position at which the rinse liquid is placed on the upper surface of the substrate W.

Figure 8:
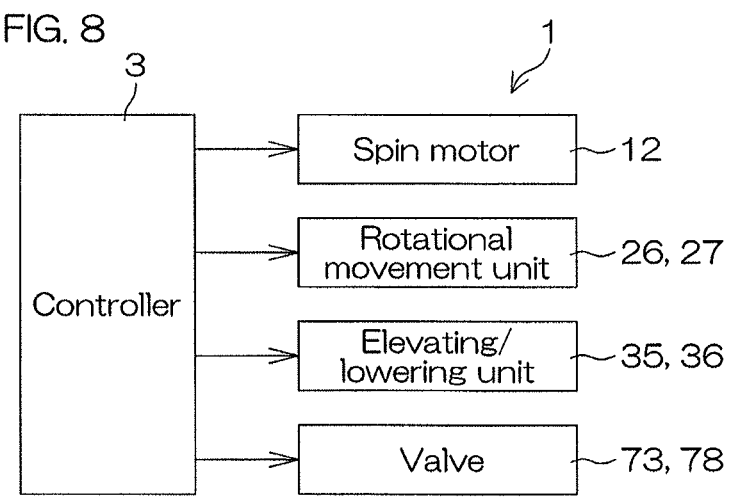
FIG. 8 is a block diagram for describing an electrical configuration of major portions of the substrate processing apparatus.

FIG. 8 is a block diagram for describing an electric configuration of major portions of the substrate processing apparatus 1.

The controller 3 is constituted with a microcomputer, for example. The controller 3 is provided with an arithmetic unit such as a CPU, a storage unit such as a read-only memory device and a hard disk drive, and an input/output unit. The storage unit stores programs which are executed by the arithmetic unit.

Further, the controller 3 is, as targets to be controlled, connected to the spin motor 12, the first rotational movement unit 26, the second rotational movement unit 27, the chemical liquid valve 73, the rinse liquid valve 78, the first elevating/lowering unit 35, the second elevating/lowering unit 36, etc. The controller 3 controls motions of the spin motor 12, the first rotational movement unit 26, the second rotational movement unit 27, the first elevating/lowering unit 35, the second elevating/lowering unit 36, etc., according to predetermined programs. The controller 3 also opens and closes the chemical liquid valve 73, the rinse liquid valve 78, etc., according to predetermined programs.

Figure 9:
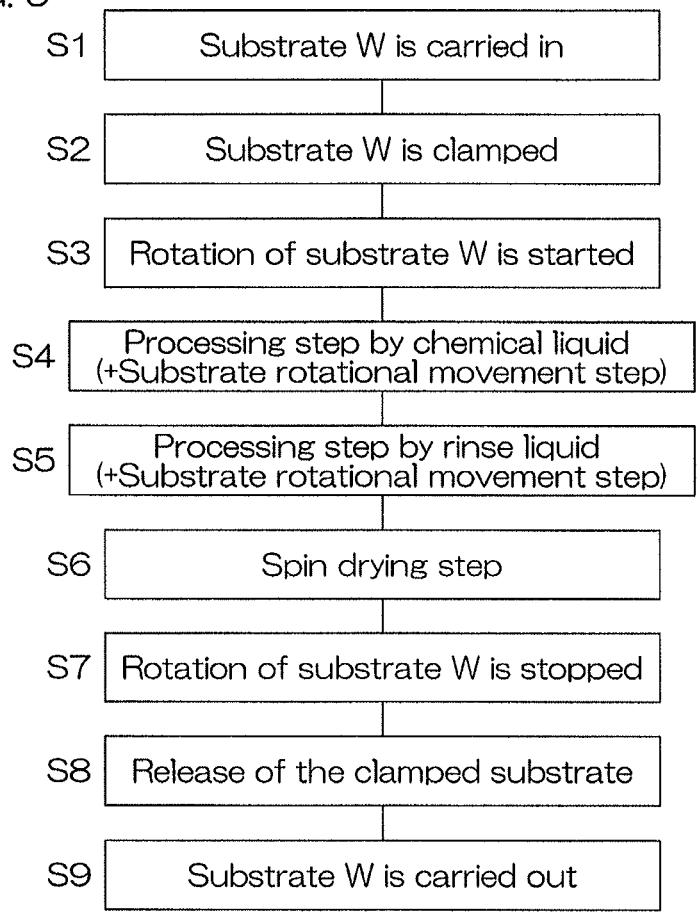
FIG. 9 is a flowchart for describing one example of substrate processing executed by the processing unit.

FIG. 9 is a flowchart for describing one example of substrate processing executed by the processing unit 2. FIGS. 10A to 10F are schematic plan views for describing a substrate rotational movement step executed by the processing step by chemical liquid (S4) and the processing step by rinse liquid (S5). Hereinafter, the substrate rotational movement step will be described with reference to FIG. 2 to FIG. 4, FIGS. 7A, 7B, FIG. 8 and FIG. 9. FIGS. 10A to 10F will be referred, whenever necessary.

The substrate processing executed by the processing unit 2 is washing processing or etching processing. The upper surface of the substrate W held by the spin chuck 5 is a target to be processed. Hereinafter, one example of substrate processing will be described with reference to FIG. 2 to FIG. 4, FIG. 8 and FIG. 9.

When the substrate W is subjected to the substrate processing by the processing unit 2, a substrate W which is not yet processed is carried into the chamber 4 (Step S1 in FIG. 9).

Specifically, the controller 3 allows the hand H2 of the substrate transfer robot CR which holds a substrate W to advance into the chamber 4. Thereby, the substrate W is delivered to the spin chuck 5, with the front surface thereof directed above. Thereafter, the controller 3 holds the substrate W (Step S2 in FIG. 9: the substrate W is held). Specifically, the controller 3 controls the first elevating/lowering unit 35 and the second elevating/lowering unit 36, arranging the first opening/closing magnet 28 and the second opening/closing magnet 30 so far positioned at the upper position to be positioned at the lower position, and also arranging the first support portion (the support portion of the first movable pin 10A) 42 and the second support portion (the support portion of the second movable pin 10B) 52 so as to be each positioned at the hold position. Thereby, each of the three first movable pins 10A and each of the three second movable pins 10B are in contact with a peripheral edge portion of the substrate W to hold the substrate W by the six movable pins 10.

After the substrate W has been held by the six movable pins 10, the controller 3 uses the spin motor 12 to start rotation of the substrate W (Step S3 in FIG. 9). The substrate W is accelerated for rotation up to a predetermined liquid processing speed (within a range of several dozens to one thousand and several hundred of rotations per minute, for example, approximately 1000 rpm) and retained at the liquid processing speed.

Then, the controller 3 executes a processing step by chemical liquid (Step S4 in FIG. 9) for processing the upper surface of the substrate W by using a chemical liquid. Specifically, the controller 3 controls the spin motor 12 to open the chemical liquid valve 73 while rotating the spin base 8, the first movable pins 10A and the second movable pins 10B around the rotation axis A1 in a rotation direction Dr1 at the liquid processing speed, discharging a chemical liquid from the chemical liquid nozzle 71 to a central portion on the upper surface of the substrate W. The chemical liquid supplied at the central portion on the upper surface of the substrate W is subjected to a centrifugal force resulting from rotation of the substrate W and flows on the upper surface of the substrate W to the peripheral edge portion of the substrate W. Thereby, the chemical liquid is fed to an entire area on the upper surface of the substrate W, and the entire area on the upper surface of the substrate W is processed by the chemical liquid.

In the processing step by chemical liquid (S4), a substrate rotational movement step is executed in which the substrate W is allowed to move rotationally with respect to the spin base 8. When the processing step by chemical liquid (S4) is started, as shown in FIG. 10A, the peripheral edge portion of the substrate W is contact-supported by each of the three first movable pins 10A by which the first support portion 42 is arranged at the first hold position P1 and by each of the three second movable pins 10B by which the second support portion 52 is arranged at the fourth hold position P12.

In the processing step by chemical liquid (S4), at timing that executes the substrate rotational movement step, the controller 3 controls the second elevating/lowering unit 36 to arrange the second opening/closing magnet 30 positioned so far at the lower position to be positioned at the upper position in a state shown in FIG. 10A, thereby moving each of the second support portions (support portion of each of the second movable pins 10B) 52 from the fourth hold position P12 to the fourth open position P17 (fourth movement step). Thereby, as shown in FIG. 10B, the first support portion 42 is arranged at the first hold position P1 and the second support portion 52 is arranged at the fourth open position P17. The three second support portions 52 separate from the peripheral edge portion of the substrate W, resulting in a state that the substrate W is held only by the three first movable pins 10A.

Then, the controller 3 controls the first rotational movement unit 26 to move relatively the three first movable pins 10A in the first circumferential direction Y1 with respect to the spin base 8. Thereby, each of the first support portions 42 is moved from the first hold position P1 to the second hold position P2, with the hold position retained (first circumferential direction movement step). In association with relative movement of each of the first support portions 42, as shown by a white arrow in FIG. 10C, the substrate W is allowed to move rotationally relatively around the rotation axis A1 with respect to the spin base 8 in a rotational movement direction Dr2 (the same direction as the first circumferential direction Y1). In association with one-time movement of the first support portion 42 from the first hold position P1 to the second hold position P2, the substrate W gives a rotational movement angle which is, for example, several degrees (for example, approximately 5°). In the preferred embodiment, a movement direction (that is, the first circumferential direction Y1) along the circumferential direction Y of the first movable pins 10A is opposite the rotation direction Dr1. Therefore, the rotational movement direction Dr2 of the substrate W is opposite the rotation direction Dr1.

Further, the controller 3 controls the second rotational movement unit 27, thereby moving the three second movable pins 10B in the second circumferential direction Y2 with respect to the spin base 8 in parallel with movement of each of the first support portions 42 to the second hold position P2. Thereby, each of the second support portions 52 so far positioned at the fourth open position P17 is arranged at the third open position P16, as shown in FIG. 10C.

Then, the controller 3 controls the second elevating/lowering unit 36 to arrange the second opening/closing magnet 30 so far positioned at the upper position to be positioned at the lower position, thereby moving each of the second support portions (support portion of the second movable pin 10B) 52 from the third open position P16 to the third hold position P11, as shown in FIG. 10D (fourth movement step). Thereby, the three second support portions 42 arranged at the third hold position P11 are in contact with the peripheral edge portion of the substrate W, thus resulting in a state that the substrate W is held by the three first movable pins 10A and the three second movable pins 10B.

Then, the controller 3 controls the first elevating/lowering unit 35 to arrange the first opening/closing magnet 28 so far positioned at the lower position to be positioned at the upper position, thereby moving each of the first support portions (support portion of the first movable pin 10A) 42 from the second hold position P2 to the second open position P7. Thereby, as shown in FIG. 10D, each of the first support portions (support portion of the first movable pin 10A) 42 is arranged at the second open position P7. The three first support portions 42 separate from the peripheral edge portion of the substrate W, thus resulting in a state that the substrate W is held only by the three second movable pins 10B.

Then, the controller 3 controls the second rotational movement unit 27, thereby moving the three second movable pins 10B in the first circumferential direction Y1 relatively with respect to the spin base 8. Thereby, each of the second support portions 52 is moved from the third hold position P11 to the fourth hold position P12, with the hold position retained, (second circumferential direction movement step). In association with relative movement of each of these second support portions 42s shown by a white arrow in FIG. 10E, the substrate W is allowed to move rotationally around the rotation axis A1 in the rotational movement direction Dr2 relatively with respect to the spin base 8. In association with one-time movement of the second support portion 52 from the third hold position P11 to the fourth hold position P12, the substrate W gives a rotational movement angle which is, for example, several degrees (for example, approximately 5°).

Further, in parallel with movement of each of the second support portions 52 to the fourth hold position P12, the controller 3 controls the first rotational movement unit 26, thereby moving the three first movable pins 10A in the second circumferential direction Y2 with respect to the spin base 8. Thereby, each of the first support portions 43 so far positioned at the second open position P7 is arranged at the first open position P6, as shown in FIG. 10E (second movement step).

Then, the controller 3 controls the first elevating/lowering unit 35 to arrange the first opening/closing magnet 28 so far positioned at the upper position to be positioned at the lower position, thereby moving each of the first support portions (support portion of the first movable pin 10A) 42 from the first open position P6 to the first hold position P1. Thereby, as shown in FIG. 11F, each of the first support portions (support portion of the first movable pin 10A) 42 is returned to the first hold position P1 (third movement step). The three first support portions 42 are in contact with the peripheral edge portion of the substrate W, thus resulting in a state that the substrate W is clamped by the three first movable pins 10A and the three second movable pins 10B.

Thereby, the substrate W is allowed to move rotationally two times (a total of approximately 10°) by a one-time substrate rotational movement motion (a series of alternately holding motions). Therefore, in the one-time substrate rotational movement motion (the series of alternately holding motions), the substrate W can be significantly changed in contact support position at the peripheral edge portion thereof. The above-described substrate rotational movement motion is intermittently executed in the processing step by chemical liquid (S4), with a predetermined period of time retained.

After the elapse of a predetermined period of time from start of discharging a chemical liquid, the controller 3 closes the chemical liquid valve 73 to stop discharge of the chemical liquid from the chemical liquid nozzle 71. Thereby, the processing step by chemical liquid (S4) is completed.

Then, the controller 3 executes a processing step by rinse liquid (Step S5 in FIG. 9) in which the chemical liquid adhered on the upper surface of the substrate W is washed away. Specifically, the controller 3 controls the spin motor 12 to open the rinse liquid valve 78, while rotating the spin base 8, the first movable pin 10A and the second movable pin 10B around the rotation axis A1 in the rotation direction Dr1 at a liquid processing speed, thereby discharging a rinse liquid from the rinse liquid nozzle 76 to the central portion on the upper surface of the substrate W. The rinse liquid supplied to the central portion on the upper surface of the substrate W is subjected to a centrifugal force resulting from rotation of the substrate W and flows on the upper surface of the substrate W to the peripheral edge portion of the substrate W. Thereby, the rinse liquid is fed to an entire area on the upper surface of the substrate W, and the chemical liquid adhered on the upper surface of the substrate W is washed far apart from the entire area on the upper surface of the substrate W.

In the processing step by rinse liquid (S5), a substrate rotational movement step is executed in which the substrate W is allowed to move rotationally with respect to the spin base 8. The substrate rotational movement step executed in the processing step by rinse liquid (S5) is a process similar to the substrate rotational movement step executed in the processing step by chemical liquid (S4) and, therefore, a detailed description will be omitted. The above-described substrate rotational movement motion is executed intermittently in the processing step by rinse liquid (S5), with a predetermined period of time retained.

After the elapse of a predetermined period of time from start of discharging the rinse liquid, the controller 3 closes the rinse liquid valve 78 to stop discharge of the rinse liquid from the rinse liquid nozzle 76. Thereby, the processing step by rinse liquid (S5) is completed.

Then, there is executed a spin drying step (Step S6 in FIG. 9) for drying a substrate W. Specifically, the controller 3 controls the spin motor 12 to accelerate rotation of the substrate W at a drying rotation speed (for example, several thousand rotations per minute, for example, 2000 rpm or more) which is greater than the rotation speed in each of the processing steps S4 and S5 and, thereafter, the substrate W is rotated at the drying rotation speed. Thereby, a large centrifugal force is applied to a liquid on the substrate W and the liquid adhered on the peripheral edge portion of the substrate W is shaken off around the substrate W. As described so far, the liquid is removed from the peripheral edge portion of the substrate W to dry the peripheral edge portion of the substrate W.

After the elapse of a predetermined period of time from start of high-speed rotation of the substrate W, the controller 3 controls the spin motor 12 to stop rotation of the substrate W by the spin chuck 5 (Step S7 in FIG. 9).

Thereafter, the controller 3 releases the thus clamped substrate W (Step S8, release of the clamped substrate in FIG. 9). Specifically, the controller 3 controls the first and second elevating/lowering units 35, 36 to arrange the first opening/closing magnet 28 and the second opening/closing magnet 30 positioned so far at the lower position to be positioned at the upper position, thereby arranging the first support portion (support portion of the first movable pin 10A) 42 and the second support portion (support portion of the second movable pin 10B) 52 each at the open position. Thereby, each of the three first support portions 42 and the three second support portions 52 separates from the peripheral edge portion of the substrate W to release the thus clamped substrate W. Thereafter, the substrate W which has been processed is carried out from the inside of the chamber 4 by the hand H2 of the substrate transfer robot CR (Step S9 in FIG. 9).

As described so far, according to the first preferred embodiment, in a state that each of the first support portions 42 is at the first hold position P1 and each of the second support portions 52 is at the open position, the substrate W is supported only by each of the first movable pins 10A. In this state, each of the first support portions 42 is moved in the first circumferential direction Y1 from the first hold position P1 to the second hold position P2, with the hold position retained, by which, in association with movement of the first support portion 42, the substrate W moves rotationally relatively in the rotational movement direction Dr2 around the rotation axis A1 with respect to the spin base 8. Further, after each of the first support portions 42 has reached the second hold position P2, each of the second support portions 52 is moved from the third open position P16 to the third hold position P11. As a result, the substrate W is held not only by each of the first movable pins 10A but also by each of the second movable pins 10B. That is, while the substrate W is supported only by each of the first movable pins 10A, each of these first movable pins 10A is moved in the first circumferential direction Y1, by which the substrate W is allowed to move rotationally relatively in the rotational movement direction Dr2 with respect to the spin base 8. Thereby, the substrate W can be changed relatively in contact support position at the peripheral edge portion thereof in the rotational movement direction Dr2, while the substrate W is satisfactorily held horizontally.

After complete movement of the second support portion 52 to the third hold position P11, each of the first support portions 42 is moved from the second hold position P2 to the second open position P7. Thereby, there develops such a state that each of the second support portions 52 is at the third hold position P11 and each of the first movable pins 10A is at the second open position P7. In this state, the substrate W is supported only by each of the second movable pins 10B. In this state, each of the second support portions 52 is moved in the first circumferential direction Y1 from the third hold position P11 to the fourth hold position P12, with the hold position retained, by which, in association with movement of the second support portion 52, the substrate W moves rotationally relatively around the rotation axis A1 in the rotational movement direction Dr2 with respect to the spin base 8. Further, after each of the second support portions 52 has reached the fourth hold position P12, each of the first support portions 42 is moved from the first open position P6 to the first hold position P1. As a result, the substrate W is held not only by each of the second movable pins 10B but also by each of the first movable pins 10A. That is, while the substrate W is supported only by each of the second movable pins 10B, each of these second movable pins 10B is moved in the first circumferential direction Y1, and the substrate W is allowed to move rotationally in the rotational movement direction Dr2. Thereby, the substrate W can be changed in contact support position at the peripheral edge portion thereof, while the substrate W is satisfactorily held horizontally.

Then, a description will be given of a second preferred embodiment.

A spin chuck according to the second preferred embodiment differs in configuration from the spin chuck 5 according to the first preferred embodiment in that a second pin support member 21 is disposed so as not to move rotationally relatively with respect to a spin base 8. That is, a second movable pin 10B is disposed so as not to move rotationally relatively with respect to the spin base 8. A first rotational movement unit 26 functions as a rotational movement unit which allows a pin support member (first pin support member 16) to move rotationally. Since the second pin support member 21 does not move rotationally with respect to the spin base 8, no second rotational movement unit 27 is provided either. In other respects, the spin chuck according to the second preferred embodiment is common in configuration to the spin chuck 5 according to the first preferred embodiment.

In the second preferred embodiment, a position which can be assumed by a second support portion 52 is only a third hold position P11 (refer to FIG. 7B) or a third open position P16 (refer to FIG. 7B). That is, a fourth hold position P12 (refer to FIG. 7B) or a fourth open position P17 (refer to FIG. 7B) is not available as a position which can be assumed by the second support portion 52.

The same processing as that shown in FIG. 9 is executed also in a processing unit according to the second preferred embodiment. In a processing step by chemical liquid (S4 in FIG. 9) and a processing step by rinse liquid (S5 in FIG. 9), there is executed a substrate rotational movement step in which a substrate W is allowed to move rotationally with respect to the spin base 8.

Figure 11A:
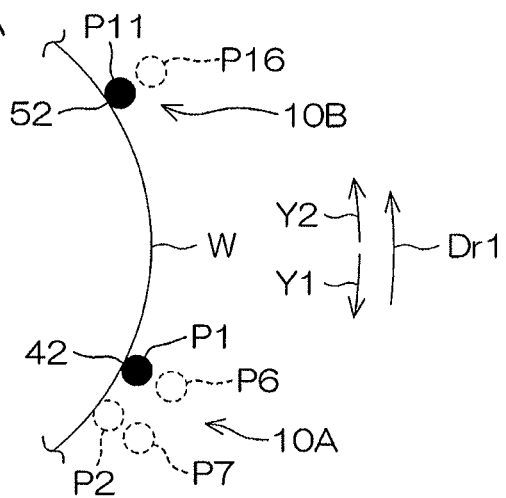

FIGS. 11A to 11F are each a schematic plan view for describing the substrate rotational movement step executed in the processing step by chemical liquid (S4) and the processing step by rinse liquid (S5) according to the second preferred embodiment. When the processing step by chemical liquid (S4) or the processing step by rinse liquid (S5) is started, as shown in FIG. 11A, the substrate W is contact-supported at a peripheral edge portion thereof by three first movable pins 10A by which a first support portion 42 is arranged at a first hold position P1 and by three second movable pins 10B by which a second support portion 52 is arranged at the third hold position P11.

Figure 11B:
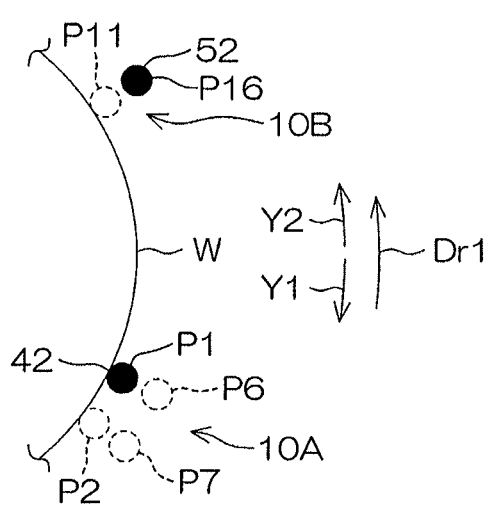
Figure 11C:
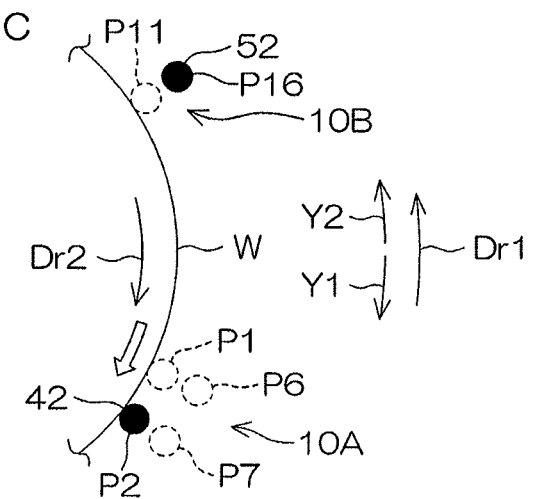

In the processing step by chemical liquid (S4) or the processing step by rinse liquid (S5), at a timing that executes the substrate rotational movement step, a controller 3 controls a second elevating/lowering unit 36 in a state shown in FIG. 11A to arrange a second opening/closing magnet 30 so far positioned at a lower position to be positioned at an upper position, thereby moving each of the second support portions (support portion of the second movable pin 10B) 52 from the third hold position P11 to the third open position P16 (fourth movement step). Thereby, as shown in FIG. 11B, the first support portion 42 is arranged at the first hold position P1 and the second support portion 52 is arranged at the third open position P16. The three second support portions 52 separate from the peripheral edge portion of the substrate W, thus resulting in a state that the substrate W is held only by the three first movable pins 10A.

Then, the controller 3 controls the first rotational movement unit 26, thereby moving the three first movable pins 10A in a first circumferential direction Y1 relatively with respect to the spin base 8. Thereby, each of the first support portions 42 is moved from the first hold position P1 to a second hold position P2, with the hold position retained, (first circumferential direction movement step). In association with relative movement of each of these first support portions 42, as shown by a white arrow in FIG. 10C, the substrate W is allowed to move rotationally relatively around a rotation axis A1 in a rotational movement direction Dr2 with respect to the spin base 8 (the same direction as the first circumferential direction Y1). In association with one-time movement of the first support portion 42 from the first hold position P1 to the second hold position P2, the substrate W gives a rotational movement angle which is, for example, several degrees (for example, approximately 5°).

Then, the controller 3 controls a second elevating/lowering unit 36 to arrange the second opening/closing magnet 30 so far positioned at the upper position to be positioned at the lower position, thereby moving each of the second support portions (support portion of the second movable pin 10B) 52 from the third open position P16 to the third hold position P11, as shown in FIG. 11D (first movement step). Thereby, the three second support portions 42 arranged at the third hold position P11 are in contact with the peripheral edge portion of the substrate W, thus resulting in a state that the substrate W is supported by the three first movable pins 10A and the three second movable pins 10B.

Then, the controller 3 controls a first elevating/lowering unit 35 to arrange the first opening/closing magnet 28 so far positioned at the lower position to be positioned at the upper position, thereby moving each of the first support portions (support portion of the first movable pin 10A) 42 from the second hold position P2 to a second open position P7. Thereby, as shown in FIG. 11D, each of the first support portions (support portion of the first movable pin 10A) 42 is arranged at the second open position P7. Three first support portions 42 separate from the peripheral edge portion of the substrate W, thus resulting in a state that the substrate W is held only by the three second movable pins 10B.

Then, the controller 3 controls the first rotational movement unit 26, thereby moving the three first movable pins 10A in a second circumferential direction Y2 with respect to the spin base 8. Thereby, as shown in FIG. 11E, each of the first support portions 42 so far positioned at the second open position P7 is arranged at a first open position P6 (second movement step).

Then, the controller 3 controls the first elevating/lowering unit 35 to arrange the first opening/closing magnet 28 so far positioned at the upper position to be positioned at the lower position, thereby moving each of the first support portions (support portion of the first movable pin 10A) 42 from the first open position P6 to the first hold position P1. Thereby, as shown in FIG. 10F, each of the first support portions (support portion of the first movable pin 10A) 42 is returned to the first hold position P1 (third movement step). Three first support portions 42 are in contact with the peripheral edge portion of the substrate W, thus resulting in a state that the substrate W is held by the three first movable pins 10A and three second movable pins 10B.

In the substrate rotational movement motion (a series of alternately holding motions), although the substrate W is allowed to move rotationally only once by a one-time substrate rotational movement motion, the substrate W can be changed in contact support position at the peripheral edge portion thereof. The above-described substrate rotational movement motion is executed intermittently, with a predetermined period of time retained, in the processing step by chemical liquid (S4) and the processing step by rinse liquid (S5).

As described so far, according to the second preferred embodiment, in a state that each of the first movable pins 10A is at the first hold position P1 and also each of the second movable pins 10B is at the third open position P16, the substrate W is supported by each of the first movable pins 10A. In this state, each of the first support portions 42 is moved from the first hold position P1 to the second hold position P2 in the first circumferential direction Y1, with the hold position retained, (execution of the first circumferential direction movement step), by which, in association with movement of the first support portion 42, the substrate W moves rotationally around the rotation axis A1 in the rotational movement direction Dr2. Further, after each of the first support portions 42 has reached the second hold position P2, each of the second support portions 52 is moved from the third open position P16 to the third hold position P11. As a result, the substrate W is held not only by each of the first movable pins 10A but also by each of the second movable pins 10B. That is, while the substrate W is supported only by each of the first movable pins 10A, each of these first movable pins 10A is moved in the first circumferential direction Y1, by which the substrate W is allowed to move rotationally in the rotational movement direction Dr2. Thereby, the substrate W can be changed in contact support position at the peripheral edge portion thereof in the rotational movement direction Dr2, while the substrate W is satisfactorily held horizontally.

Figure 12:
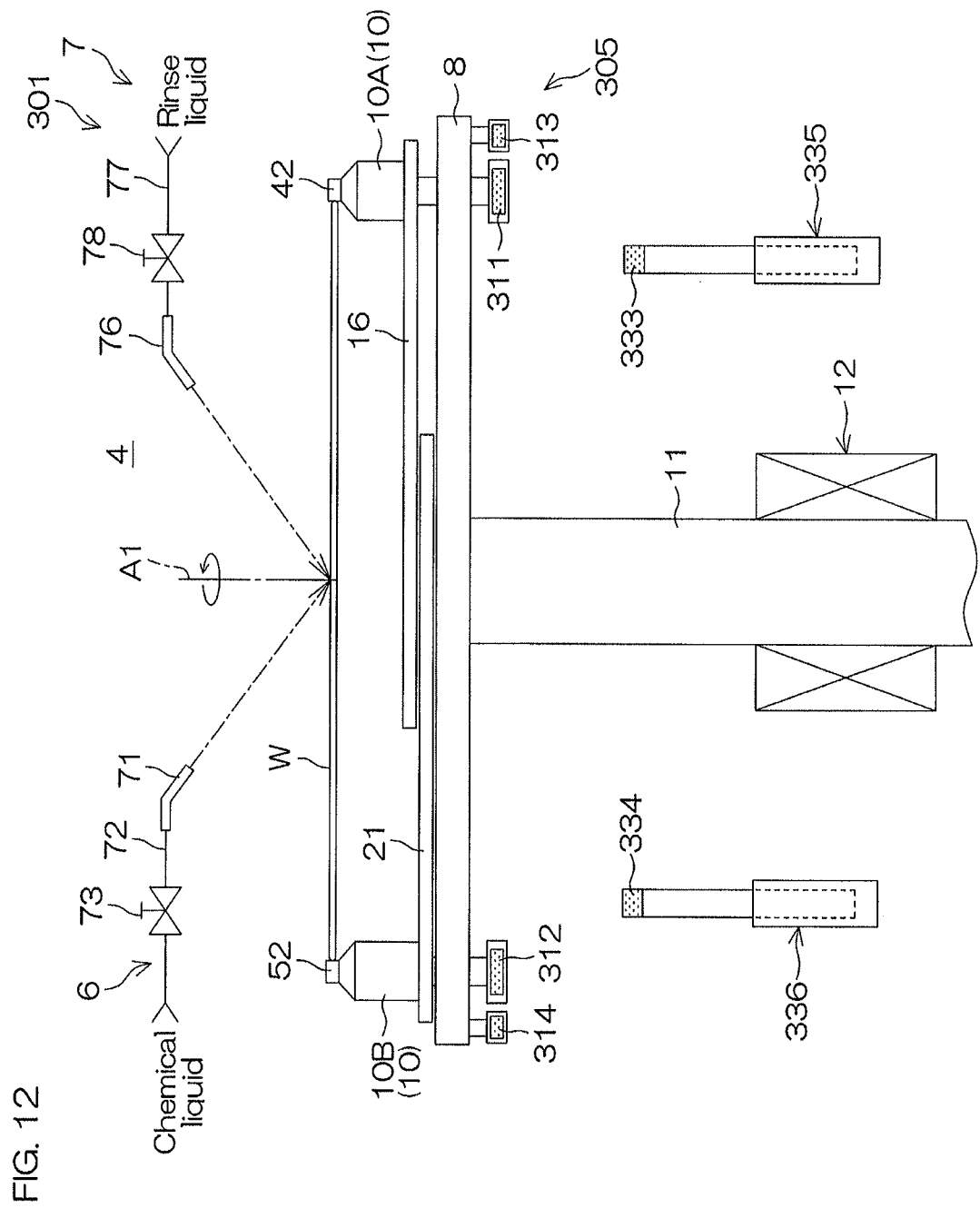
FIG. 12 is an illustrative cross sectional view for describing a configuration example of a processing unit according to a third preferred embodiment of the present invention.
Figure 13:
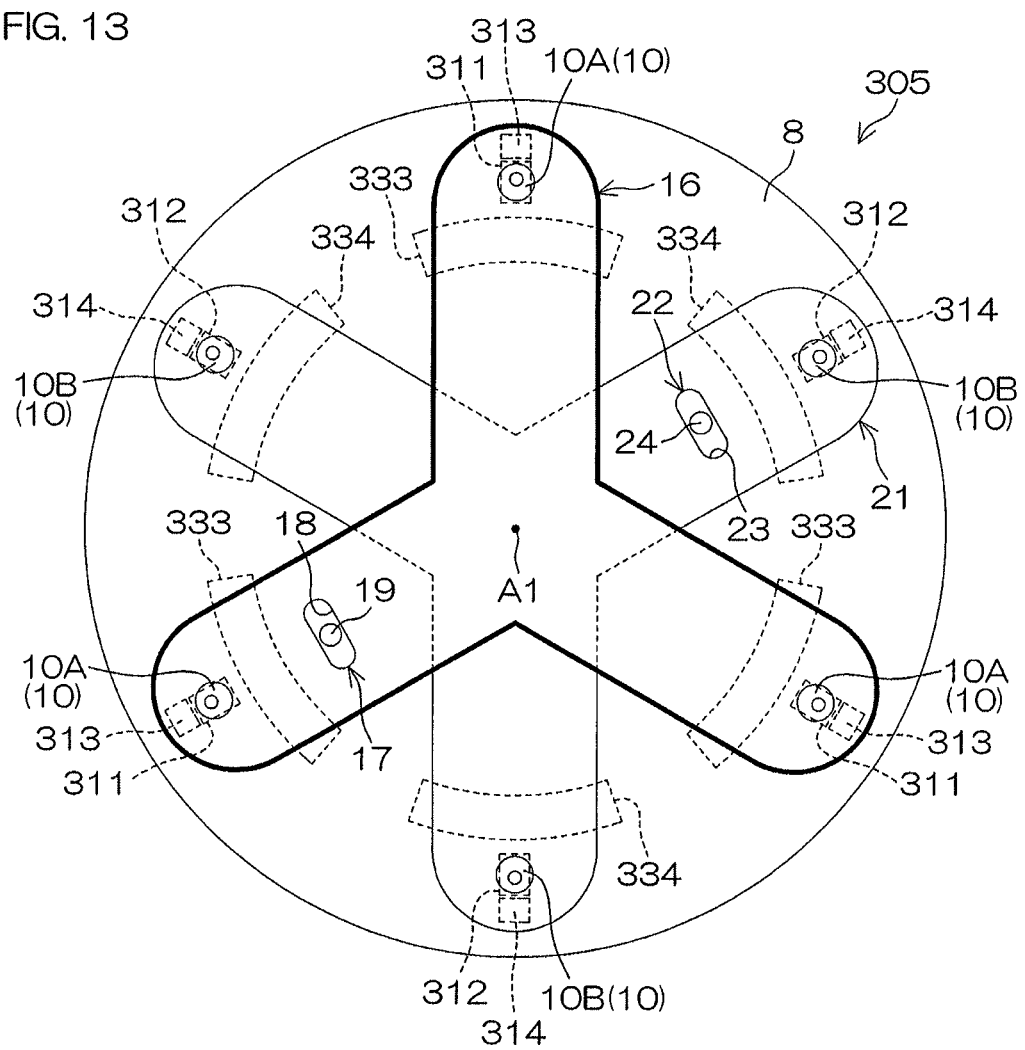
FIG. 13 is a plan view for describing a more specific configuration of a spin chuck provided at the processing unit.

FIG. 12 is an illustrative cross sectional view for describing a configuration example of a processing unit of a substrate processing apparatus 301 according to a third preferred embodiment of the present invention. FIG. 13 is a plan view for describing a more specific configuration of a spin chuck 305 included in the processing unit. In the third preferred embodiment, portions common to those of the previously described first preferred embodiment (the preferred embodiment shown in FIG. 1 to FIG. 10) are given the same reference numbers as those of FIG. 1 to FIG. 10, with a description omitted.

The spin chuck 305 according to the third preferred embodiment differs from the spin chuck 5 according to the first preferred embodiment mainly in that a first driving magnet 311 and a second driving magnet 312 disposed respectively at a first movable pin 10A and a second movable pin 10B are subjected to a magnetic force from each of a third elevated/lowered magnet 333 and a fourth elevated/lowered magnet 334, thereby opening and closing the first movable pin 10A and the second movable pin 10B. More specifically, the spin chuck 305 differs in that, as a second movement unit, in place of the first opening/closing magnet 28 (refer to FIG. 3), the first link mechanism 29 (refer to FIG. 3), the first elevated/lowered magnet 33 (refer to FIG. 3) and the first elevating/lowering unit 35 (refer to FIG. 3), there are disposed the first driving magnet 311, a first urging magnet 313, a third elevated/lowered magnet 333 and a third elevating/lowering unit 335. The spin chuck 305 also differs in that, as a fourth movement unit, in place of the second opening/closing magnet 30 (refer to FIG. 3), the second link mechanism 31 (refer to FIG. 3), the second elevated/lowered magnet 34 (refer to FIG. 3) and the second elevating/lowering unit 36 (refer to FIG. 3), there are disposed the second driving magnet 312, a second urging magnet 314, a fourth elevated/lowered magnet 334 and a fourth elevating/lowering unit 336.

As shown in FIG. 12 and FIG. 13, one unit of the first driving magnet 311 is disposed so as to correspond to each of the first movable pins 10A. The first driving magnet 311 is a permanent magnet and extends linearly horizontally. Magnetic pole directions of the three first driving magnets 311 corresponding to the plurality of (for example, three) first movable pins 10A are common to each other in terms of a rotation radial direction of the substrate W in a state that no external force is applied to the first movable pins 10A.

As shown in FIG. 12 and FIG. 13, one unit of the second driving magnet 312 is disposed so as to correspond to each of the second movable pins 10B. The second driving magnet 312 is a permanent magnet and extends linearly and horizontally. Magnetic pole directions of the three first driving magnets 312 corresponding to the plurality of (for example, three) second movable pins 10B are common to each other in terms of a rotation radial direction of the substrate W in a state that no external force is applied to the corresponding second movable pins 10B. The magnetic pole direction of the first driving magnet 311 is different from that of the second driving magnet 312 in terms of the rotation radial direction of the substrate W.

The spin chuck 305 is provided with the spin base 8 on which urging magnets equal in number (six) to the movable pins 10 are disposed as an urging unit. The urging magnets are disposed on a one-to-one basis on the movable pins 10 and each is arranged so as to be adjacent to a corresponding movable pin 10. In the preferred embodiment, as shown in FIG. 13, the urging magnets are arranged around the corresponding movable pins 10 toward a direction far apart from the rotation axis A1 from a central position of the movable pin 10 in a plan view. The plurality of urging magnets include three first urging magnets 313 which are disposed so as to correspond to the first movable pins 10A, exerting a magnetic force in relation to the first driving magnet 311 and three second urging magnets 314 which are disposed so as to correspond to the second movable pins 10B, exerting a magnetic force in relation to the second driving magnet 312. The first urging magnets 313 and the second urging magnets 314 are disposed alternately in the circumferential direction Y of the spin base 8 and also so as not to be elevated or lowered with respect to the spin base 8.

A third elevated/lowered magnet 333 and a fourth elevated/lowered magnet 334 are disposed below the spin base 8. A magnetic pole direction of the third elevated/lowered magnet 333 and that of the fourth elevated/lowered magnet 334 are both a direction along a vertical direction but opposite to each other. Where an upper surface of the third elevated/lowered magnet 333 is, for example, of an N pole, an upper surface of the fourth elevated/lowered magnet 334 is of an S pole of opposite polarity.

As shown in FIG. 13, in the preferred embodiment, the third elevated/lowered magnets 333 and the fourth elevated/lowered magnets 334 are disposed each by three units. The three third elevated/lowered magnets 333 and the three fourth elevated/lowered magnets 334 are arranged alternately in the circumferential direction Y in a plan view.

The three third elevated/lowered magnets 333 are each formed in a circular-arc shape at the center of the rotation axis A1 and arranged at a mutually common height position, with an equal interval retained in the circumferential direction Y. The three third elevated/lowered magnets 333 are arranged on a circumference coaxial to the rotation axis A1 in the circumferential direction Y, with an equal interval retained. A third elevating/lowering unit 335 for elevating and lowering collectively the plurality of third elevated/lowered magnets 333 is connected to the third elevated/lowered magnets 333. The third elevating/lowering unit 335 has, for example, a configuration which includes a cylinder disposed so as to expand and contract in the vertical direction, and it is supported by the cylinder. The third elevating/lowering unit 335 may also be constituted by using an electric motor. Further, the third elevating/lowering unit 335 may have a configuration which includes a plurality of individual elevating/lowering units for individually elevating and lowering the third elevated/lowered magnets 333.

In the third preferred embodiment, the second movement unit is constituted with the first driving magnet 311, the first urging magnet 313, the third elevated/lowered magnet 333 and the third elevating/lowering unit 335.

Three fourth elevated/lowered magnets 334 are formed in a circular-arc shape at the center of the rotation axis A1 and arranged at a mutually common height position in the circumferential direction Y, with an interval retained. The three fourth elevated/lowered magnets 334 are arranged on a circumference coaxial to the rotation axis A1 in the circumferential direction Y, with an equal interval retained. A fourth elevating/lowering unit 336 for elevating and lowering collectively the plurality of fourth elevated/lowered magnets 334 is connected to the fourth elevated/lowered magnets 334. The fourth elevating/lowering unit 336 has, for example, a configuration which includes a cylinder disposed so as to expand and contract in the vertical direction, and it is supported by the cylinder. The fourth elevating/lowering unit 336 may also be constituted by using an electric motor. Further, the fourth elevating/lowering unit 336 may have a configuration which includes a plurality of individual elevating/lowering units for individually elevating and lowering the fourth elevated/lowered magnets 334.

In the third preferred embodiment, the fourth movement unit is constituted with the second driving magnet 312, the second urging magnet 314, the fourth elevated/lowered magnet 334, and the fourth elevating/lowering unit 336.

As shown in FIGS. 14A and 14B, the first driving magnet 311 is joined to a lower end of the first support shaft 45 of each of the first movable pins 10A.

FIG. 14A shows a state that the third elevated/lowered magnet 333 is at the lower position, and FIG. 14B shows a state that the third elevated/lowered magnet 333 is at the upper position. Even in a state that the third elevated/lowered magnet 333 and the first driving magnet 311 are flush with each other in terms of a Y position in the circumferential direction, no magnetic force from the third elevated/lowered magnet 333 will act on the first driving magnet 311 in a state that the third elevated/lowered magnet 333 is at the lower position, as shown in FIG. 14A. Therefore, the first support portion 42 of the first movable pin 10A is positioned at the hold position. In this state, the first driving magnet 311 is arranged so that an N pole faces inward in the radial direction of the spin base 8 and also an S pole faces outward in the radial direction of the spin base 8.

The third elevated/lowered magnet 333 is elevated in a state shown in FIG. 14A and arranged at the upper position. The upper surface of the third elevated/lowered magnet 333 comes close to the first driving magnet 311 to cause an attractive magnetic force at the first driving magnet 311, thereby causing an attractive force between the first driving magnet 311 and the third elevated/lowered magnet 333. Magnitude of the attractive magnetic force acting on the first driving magnet 311 in a state that the third elevated/lowered magnet 333 has been arranged at the upper position is much greater than that of the attractive magnetic force from the first urging magnet 313. Thereby, the first support portion 42 moves from the hold position close to the rotation axis A1 to the open position far apart from the rotation axis A1 (refer to FIG. 12). Thereby, the first support portion 42 is urged to the open position. In this state, as shown in FIG. 14B, the first driving magnet 311 is such that, for example, the S pole faces inward in the radial direction of the spin base 8 and also the N pole faces outward in the radial direction of the spin base 8.

FIG. 15A shows a state that the fourth elevated/lowered magnet 334 is at the lower position and FIG. 15B shows a state that the fourth elevated/lowered magnet 334 is at the upper position. Even in a state that the fourth elevated/lowered magnet 334 and the second driving magnet 312 are flush with each other in terms of the Y position in the circumferential direction, no magnetic force from the fourth elevated/lowered magnet 334 will act on the second driving magnet 312 in a state that the fourth elevated/lowered magnet 334 is at the lower position, as shown in FIG. 15A. Therefore, the second support portion 52 of the second movable pin 10B is positioned at the hold position. In this state, the second driving magnet 312 is arranged so that, for example, an S pole faces inward in the radial direction of the spin base 8 and an N pole faces outward in the radial direction of the spin base 8.

The fourth elevated/lowered magnet 334 is elevated in a state shown in FIG. 15A and arranged at the upper position. The upper surface of the fourth elevated/lowered magnet 334 comes close to the second driving magnet 312 to cause an attractive magnetic force at the second driving magnet 312, thereby causing an attractive force between the second driving magnet 312 and the fourth elevated/lowered magnet 334. In a state that the fourth elevated/lowered magnet 334 is arranged at the upper position, magnitude of the attractive magnetic force acting on the second driving magnet 312 is much greater than that of the attractive magnetic force from the second urging magnet 314. Thereby, the second support portion 52 moves from the hold position close to the rotation axis A1 to the open position far apart from the rotation axis A1 (refer to FIG. 12). Thereby, the second support portion 52 is urged to the open position. In this state, as shown in FIG. 15B, the second driving magnet 312 is such that the N pole faces inward in the radial direction of the spin base 8 and the S pole faces outward in the radial direction of the spin base 8.

Figure 16B:
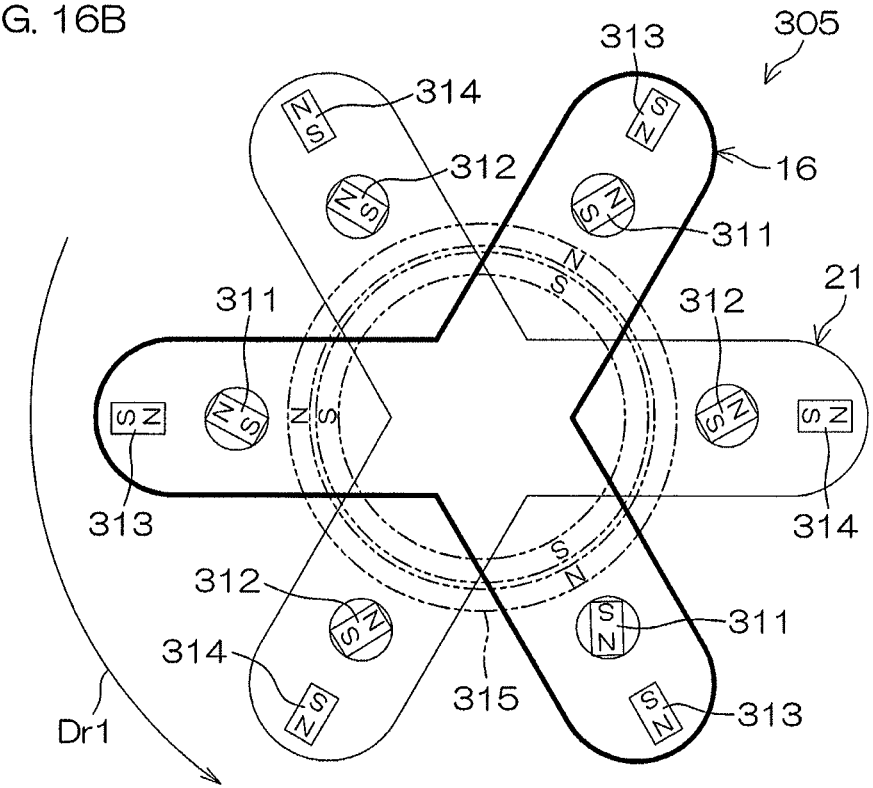
Figure 16C:
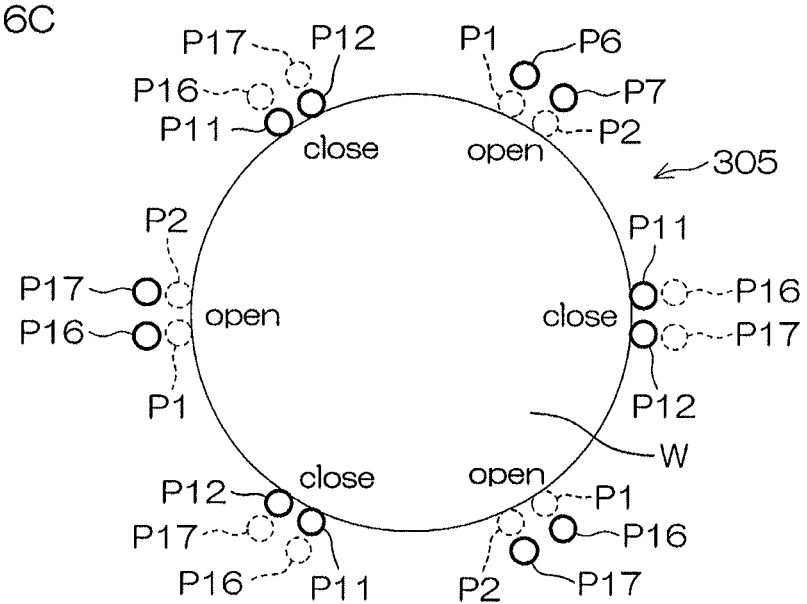
Figure 17B:
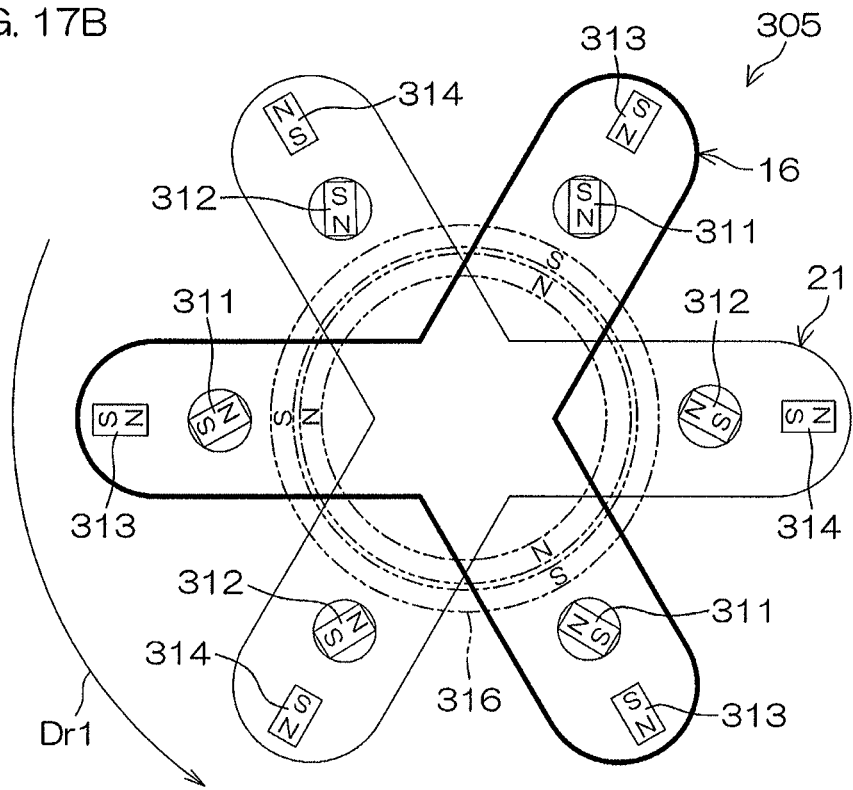
Figure 17C:
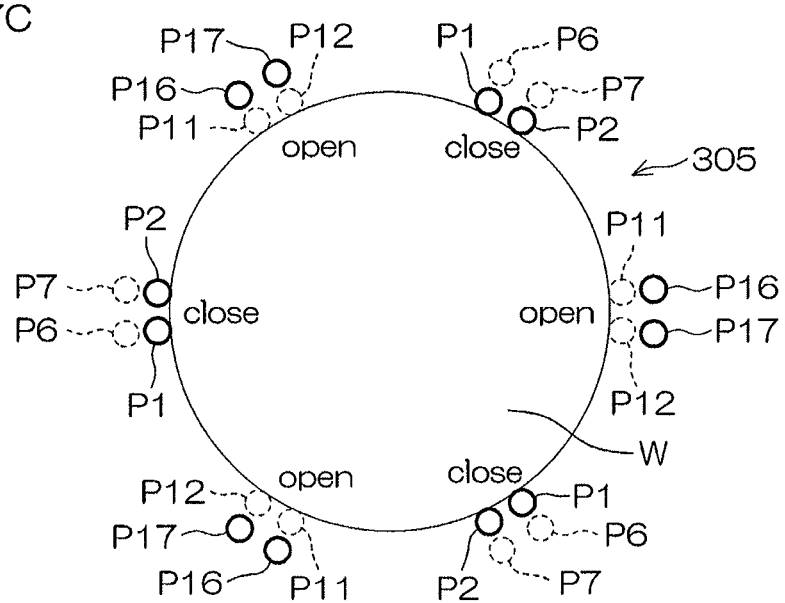

FIGS. 16A to 16C and FIGS. 17A to 17C are schematic views which show states of the first movable pin 10A and the second movable pin 10B. FIGS. 16A, 16B, 17A and 17B show states of the third and fourth elevated/lowered magnets 333, 334. FIG. 16C and FIG. 17C show states of opening and closing the support portions (the first support portion 42 and the second support portion 52) of each of the movable pins 10.

The third and fourth elevated/lowered magnets 333 and 334 are arranged in the circumferential direction of the spin base 8, with an equal interval of 60° retained, and the movable pins 10 are also arranged, with an equal interval of 60° retained. Therefore, as shown in FIG. 16A and FIG. 17A, there can develop such an initial state that each of the third elevated/lowered magnets 333 and each of the first driving magnets 311 are individually made equal in angle position and also each of the fourth elevated/lowered magnets 334 and each of the first driving magnets 312 are individually made equal in angle position.

FIGS. 16A to 16C each shows a state that the third elevated/lowered magnet 333 is arranged at the upper position and also the fourth elevated/lowered magnet 334 is arranged at the lower position. In this case, as shown in FIG. 16A, when the spin base 8 is in the initial state and also in a stationary state, the first support portion 42 of each of the three first movable pins 10A is arranged at the open position (open) and the second support portion 52 of each of the three second movable pins 10B is arranged at the hold position (close).

Consideration is given to a state that the spin base 8 is rotated in a state shown in FIG. 16A. The spin base 8 is to rotate at a liquid processing speed (within a range of several dozens to one thousand and several hundred rotations per minute and, for example, approximately 1000 rpm). In a rotation state of the spin base 8, a magnetic field generation region 315 (refer to FIG. 16B) is formed along an annular region through which the first driving magnet 311 and the second driving magnet 312 which rotate in association with rotation of the spin base 8 pass. The circumferential direction Y length (angle) of the magnetic field generation region 315 is longer than the circumferential direction length (angle) of the third elevated/lowered magnet 333 which corresponds thereto. The third elevated/lowered magnet 333 is about 50° to 55° in circumferential direction length (angle) and also the three third elevated/lowered magnets 333 are disposed in the circumferential direction Y of the spin base 8. Therefore, when the substrate W is rotated at a liquid processing speed, the full circumferential annular magnetic field generation region 315 (refer to FIG. 16B) is formed along an annular region through which the first driving magnet 311 and the second driving magnet 312 which rotate in association with rotation of the spin base 8 pass.

Since the magnetic field generation region 315 (refer to FIG. 16B) is formed in a full circumferential annular shape, irrespective of a rotation posture of the spin base 8, an attractive magnetic force from the third elevated/lowered magnet 333 acts on the first driving magnet 311. Therefore, as shown in FIG. 16C, in a rotation state of the spin base 8, the first support portion 42 of each of the three first movable pins 10A is arranged at the open position (open). Of course, the second support portion 52 of each of the three second movable pins 10B is arranged at the hold position (close). At this time, the substrate W is supported by three second movable pins 10B and rotated satisfactorily. Further, in FIG. 16C, the first support portion 42 is arranged at one of the first open position P6 and the second open position P7 (refer to FIG. 7A as well). Further, the second support portion 52 is arranged at one of the third hold position P11 and the fourth hold position P12 (refer to FIG. 7B as well). In FIG. 16C, the positions at which the first support portion 45 and the second support portion 52 can be arranged are shown by thick lines.

FIGS. 17A to 17C each shows a state that the fourth elevated/lowered magnet 334 is arranged at the upper position and also the third elevated/lowered magnet 333 is arranged at the lower position. In this case, when the spin base 8 is in the initial state and also in a stationary state as shown in FIG. 17A, the second support portion 52 of each of three second movable pins 10B is arranged at the open position (open) and also the first support portion 42 of each of three first movable pins 10A is arranged at the hold position (close).

Consideration is given to a case where the spin base 8 is rotated in a state shown in FIG. 17A. The spin base 8 is to rotate at a liquid processing speed (within a range of several dozens to one thousand and several hundred rotations per minute, for example, approximately 1000 rpm). In a rotation state of the spin base 8, a magnetic field generation region 316 (refer to FIG. 17B) is formed along an annular region through which the first driving magnet 311 and the second driving magnet 312 which rotate in association with rotation of the spin base 8 pass. The circumferential direction Y length (angle) of the magnetic field generation region 316 is longer than the circumferential direction length (angle) of the fourth elevated/lowered magnet 334 which corresponds thereto. The fourth elevated/lowered magnet 334 is approximately 50° to 55° in circumferential direction length (angle) and also the three fourth elevated/lowered magnets 334 are disposed in the circumferential direction Y of the spin base 8. Therefore, when the substrate W is rotated at a liquid processing speed, a full circumferential annular magnetic field generation region 316 (refer to FIG. 17B) is formed along an annular region through which the first driving magnet 311 and the second driving magnet 312 which rotate in association with rotation of the spin base 8 pass.

Since the magnetic field generation region 316 (refer to FIG. 17B) is formed in a full circumferential annular shape, irrespective of a rotation posture of the spin base 8, an attractive magnetic force from the fourth elevated/lowered magnet 334 acts on the second driving magnet 312. Therefore, in a rotation state of the spin base 8, as shown in FIG. 17C, the second support portion 52 of each of three second movable pins 10B is arranged at the open position (open). Of course, the first support portion 42 of each of three first movable pins 10A is arranged at the hold position (close). At this time, the substrate W is supported by the three first movable pins 10A and rotated satisfactorily. Further, in FIG. 17C, the second support portion 52 is arranged at one of the third open position P16 and the fourth open position P17 (refer to FIG. 7B as well). Further, the first support portion 42 is arranged at one of the first hold position P1 and the second hold position P2 (refer to FIG. 7A as well). In FIG. 17C, the positions at which the first support portion 42 and the second support portion 52 can be arranged are shown by thick lines.

As described so far, there can develop such a state that while the substrate W is rotating, the third elevated/lowered magnet 333 is arranged at the upper position and also the fourth elevated/lowered magnet 334 is arranged at the lower position (refer to FIGS. 16A to 16C), thereby realizing a state that the substrate W is supported only by three second movable pins 10B. There also develops a state that the fourth elevated/lowered magnet 334 is arranged at the upper position and the third elevated/lowered magnet 333 is arranged at the lower position (refer to FIGS. 17A to 17C), by which the state can be switched to a state that the substrate W is supported only by three first movable pins 10A.

Figure 18:
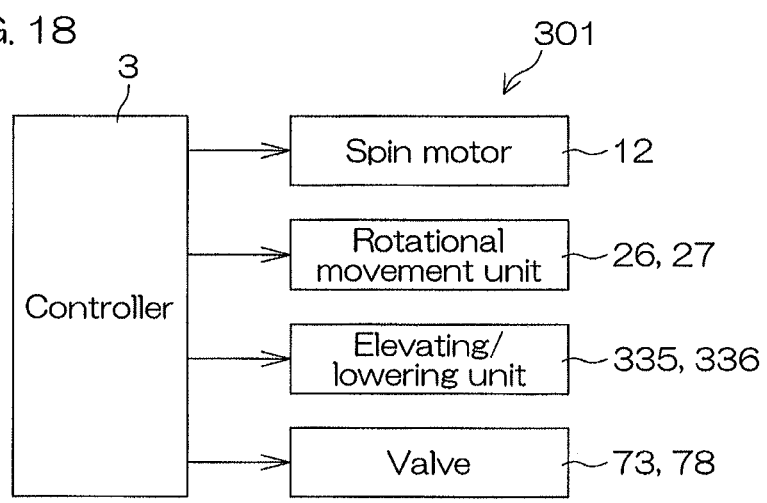
FIG. 18 is a block diagram for describing an electric configuration of major portions of the substrate processing apparatus.

FIG. 18 is a block diagram for describing an electric configuration of major portions of the substrate processing apparatus 301. The controller 3 is further connected to the third elevating/lowering unit 335, the fourth elevating/lowering unit 336, etc., as targets to be controlled. The controller 3 also controls motions of the third elevating/lowering unit 335, the fourth elevating/lowering unit 336, etc., according to predetermined programs.

The spin chuck 305 according to the third preferred embodiment is able to open and close individually the three first movable pins 10A and the three second movable pins 10B, while the first movable pins 10A and the second movable pins 10B are rotated around the rotation axis A1.

Further, even where each of the first movable pins 10A is at any position with respect to the spin base 8 from the first circumferential direction position P51 (refer to FIG. 7A) to the second circumferential direction position P52 (refer to FIG. 7A), the spin chuck 305 is able to open and close each of the first movable pins 10A. Even where each of the second movable pins 10B is at any position with respect to the spin base 8 from the third circumferential direction position P53 (refer to FIG. 7B) to the fourth circumferential direction position P54 (refer to FIG. 7B), it is also able to open and close each of the second movable pins 10B.

In the processing unit according to the third preferred embodiment, processing similar to that shown in FIG. 9 is executed. In the processing step by chemical liquid (S4 in FIG. 9) and the processing step by rinse liquid (S5 in FIG. 9), there is executed the substrate rotational movement step (refer to FIG. 10A to FIG. 10F) in which the substrate W is allowed to move rotationally with respect to the spin base 8.

Although a description has been so far given of the three preferred embodiments of the present invention, the present invention can be carried out in still other preferred embodiments.

For example, in the first and third preferred embodiments, as a substrate rotational movement step, there may be executed the process shown in FIGS. 11A to 11F. That is, the substrate rotational movement step which uses the first movable pins 10A and the substrate rotational movement step which uses second movable pins 10B are not executed simultaneously, but there may be executed only one of the substrate rotational movement step which uses the first movable pins 10A and the substrate rotational movement step which uses the second movable pins 10B.

Further, the second preferred embodiment may be combined with the third preferred embodiment. In this case, the second pin support member 21 is disposed so as not to move rotationally relatively with respect to the spin base 8 and, therefore, the second movable pin 10B is disposed so as not to move rotationally relatively with respect to the spin base 8. Since the second pin support member 21 does not move rotationally with respect to the spin base 8, no second rotational movement unit 27 is provided either. In this case, there is executed the process shown in FIGS. 11A to 11F, as a substrate rotational movement step.

Further, in the first to third preferred embodiments, the substrate rotational movement step may be executed in only one of the processing step by chemical liquid (S4) and the processing step by rinse liquid (S5) (for example, the processing step by chemical liquid (S4)) in place of both the processing step by chemical liquid (S4) and the processing step by rinse liquid (S5).

Further, in the first to third preferred embodiments, the substrate rotational movement step which is executed in the processing step by chemical liquid (S4) and/or in the processing step by rinse liquid (S5) may be executed continuously a plural number of times.

Further, in the first to third preferred embodiments, the rotational movement direction of the substrate W in the substrate rotational movement step may be the same as the rotation direction of the substrate W in the processing step by chemical liquid (S4) and the processing step by rinse liquid (S5), in place of being opposite the rotation direction of the substrate W in the processing step by chemical liquid and the processing step by rinse liquid.

Further, in the second preferred embodiment, not the second pin support member 21 but the first pin support member 16 may be disposed so as not to move rotationally relatively with respect to the spin base 8. That is, a description has been given that the second movable pins 10B do not move in the circumferential direction Y but the first movable pins 10A move in the circumferential direction Y. On the contrary, there may be provided such a configuration that the first movable pins 10A do not move in the circumferential direction Y but the second movable pins 10B move in the circumferential direction Y.

Further, in the first to third preferred embodiments, a description has been given of a configuration example in which three pairs of the first movable pins 10A and the second movable pins (total of six) are disposed. However, four or more pairs of the first movable pins 10A and the second movable pins 10B may be disposed.

Further, in the first to third preferred embodiments, a processing liquid (chemical liquid or rinse liquid) may be supplied to the lower surface of the substrate W held by the spin chuck 5 or 305. In this case, the processing liquid is allowed to flow around the upper surface of the substrate W from the lower surface of the substrate W at a substrate supporting position in the peripheral edge portion of the substrate W, thus making it possible to satisfactorily process the peripheral edge portion of the substrate W by using the processing liquid, without any unprocessed portions left.

Further, in the first to third preferred embodiments, there may be provided such a configuration that the movable pins (first movable pins 10A and/or second movable pins 10B) of the spin chuck 5 or 305 do not move in the circumferential direction Y but only the support portion (first support portion 42 and/or second support portion 52) moves.

Further, as an open position of each of the movable pins 10, there are disposed two positions (first and second open positions P6, P7 or third and fourth open positions P16, P17). However, as an open position of each of the movable pins 10, only one open position may be disposed.

Further, in the first to third preferred embodiments, the substrate rotational movement step may be executed in the spin drying step (S6 in FIG. 9). The substrate rotational movement step includes motions in which the substrate W is held alternately between the first movable pins 10A and the second movable pins 10B. Therefore, in the spin drying step (S6) in which the substrate W is rotated at 2000 rpm or higher, the substrate rotational movement step can be executed to remove a liquid remaining at the first movable pins 10A and the second movable pins 10B.

In the first to third preferred embodiments, a description has been given that the substrate rotational movement step is executed in parallel with rotation of the substrate W. However, the substrate-rotational movement step may be executed in parallel with stop of rotation of the substrate W.

Further, a description has been given of a case where the substrate processing apparatus 1 or 301 is an apparatus for processing a circular-plate shaped semiconductor substrate. The substrate processing apparatus 1 or 301 may be an apparatus for processing a polygonal substrate such as glass substrates for liquid crystal display devices.

Also, the present invention may be changed in design in various ways within a scope not departing from the scope of the claims of the present invention.

While preferred embodiments of the present invention have been described in detail above, these are merely specific examples used to clarify the technical contents of the present invention, and the present invention should not be interpreted as being limited to these specific examples, and the scope of the present invention shall be limited only by the appended claims.

The present application corresponds to Japanese Patent Application No. 2017-60022 filed on Mar. 24, 2017 in the Japan Patent Office and the entire disclosure of this application is incorporated herein by reference.

What is claimed is:

1. A substrate holding/rotating device which rotates a substrate around a rotation axis extending along a vertical direction, while holding the substrate horizontally, the substrate holding/rotating device, comprising:
   a spin base provided to be rotatable around the rotation axis; and
   a plurality of movable pins which are arranged along a circumference centered on the rotation axis, the movable pins each having a support portion configured to contact with a peripheral edge portion of the substrate to support the substrate; wherein
   the plurality of movable pins include a first pin group including at least three movable pins and a second pin group including at least three movable pins,
   the support portion of each of the movable pins included in the first pin group is disposed so as to move between a hold position close to the rotation axis and an open position further away from the rotation axis than the hold position, the hold position including a first hold position and a second hold position defined with respect to the spin base, the second hold position being apart from the first hold position in a circumferential direction around the rotation axis, the support portion of each of the movable pins included in the first pin group being movable in the circumferential direction between the first hold position and the second hold position with respect to the spin base, and
   the support portion of each of the movable pins included in the second pin group is disposed so as to move between a hold position close to the rotation axis and an open position further away from the rotation axis than the hold position,
   the substrate holding/rotating device further comprising:
   a first pin support member that supports the movable pins included in the first pin group, the first pin support member coupled to the spin base so as to rotate together with the spin base around the rotation axis such that the first pin support member is rotationally relatively movable around the rotation axis with respect to the spin base while rotating together with the spin base around the rotation axis, thereby to move the support portion of each of the movable pins included in the first pin group in the circumferential direction between the first hold position and the second hold position with respect to the spin base when the support portion of each of the movable pins included in the first pin group is at the hold position thereof;
   a second pin support member, provided separately from the first pin support member, that supports the movable pins included in second pin group, the second pin support member coupled to the spin base so as to rotate together with the spin base around the rotation axis;
   a motor for rotating the spin base, the first pin support member and the second pin support member together around the rotation axis; and
   a first movement unit which causes the first pin support member to move rotationally relatively with respect to the spin base around the rotation axis,
   wherein when the support portion of each of the movable pins included in the first pin group is at the hold position and the support portion of each of the movable pins included in the second pin group is at the respective open position, the substrate can be supported by each of the movable pins included in the first pin group, and
   the first movement unit rotates the first pin support member relative to the spin base around the rotation axis, whereby the support portion of each of the movable pins included in the first pin group is moved directly in the circumferential direction between the first hold position and the second hold position without moving through the open position.

2. The substrate holding/rotating device according to claim 1, wherein
   where the support portion of each of the movable pins included in the second pin group is at the hold position and also the support portion of each of the movable pins included in the first pin group is at the open position, the substrate can be supported by each of the movable pins included in the second pin group,
   the substrate holding/rotating device further comprising: a first support portion movement unit which moves the support portion of each of the movable pins included in the first pin group between the open position and the hold position, and
   a second support portion movement unit which moves the support portion of each of the movable pins included in the second pin group between the open position and the hold position, and
   a controller which controls the first movement unit, the first support portion movement unit and the second support portion movement unit, wherein
   the controller is programmed to execute a first circumferential direction movement step in which, in a state that each of the movable pins included in the first pin group is at the hold position and each of the movable pins included in the second pin group is at the open position, the support portion of each of the movable pins included in the first pin group is moved in the circumferential direction by the first movement unit from the first hold position to the second hold position with respect to the spin base, and a first movement step in which, after completion of the first circumferential direction movement step, the support portion of each of the movable pins included in the second pin group is moved by the second support portion movement unit from the open position to the hold position.

3. The substrate holding/rotating device according to claim 2, wherein
   the controller is further programmed to execute a second movement step in which, after completion of the first movement step, the first support portion movement unit is controlled to move the support portion of each of the movable pins included in the first pin group from the second hold position to the open position, and a third movement step in which, after the second movement step, the first support portion movement unit is controlled to move the support portion of each of the movable pins included in the first pin group from the open position to the first hold position.

4. The substrate holding/rotating device according to claim 2, wherein
   the controller is further programmed to execute a fourth movement step in which, in a state that the support portion of each of the movable pins included in the first pin group and that in the second pin group are arranged at the hold position, prior to start of the first circumferential direction movement step, the second support portion movement unit is controlled to move the support portion of each of the movable pins included in the second pin group from the hold position to the open position.

5. The substrate holding/rotating device according to claim 2, wherein
the controller is further programmed to execute a rotation step in which the motor is controlled to rotate the spin base together with the plurality of movable pins around the rotation axis, and to execute the first circumferential direction movement step and the first movement step in parallel with the rotation step.

6. The substrate holding/rotating device according to claim 2, wherein
the hold position of the support portion of each of the movable pins included in the second pin group includes a third hold position and a fourth hold position defined with respect to the spin base, the fourth hold position being apart from the third hold position in the circumferential direction, the support portion of each of the movable pins included in the second pin group being movable in the circumferential direction between the third hold position and the fourth hold position with respect to the spin base,
the second pin support member is rotationally relatively movable around the rotation axis with respect to the spin base while rotating together with the spin base around the rotation axis, thereby to move the support portion of each of the movable pins included in the second pin group in the circumferential direction between the third hold position and the fourth hold position with respect to the spin base when the support portion of each of the movable pins included in the second pin group is at the hold position thereof, and
the substrate holding/rotating device further comprising:
a second movement unit that causes the second pin support member to move rotationally relatively with respect to the spin base around the rotation axis, thereby to move the support portion of each of the movable pins included in the second pin group between the third hold position and the fourth hold position with respect to the spin base; wherein
the controller is further programmed to execute a second movement step in which, after completion of the first movement step, the first support portion movement unit is controlled to move the support portion of each of the movable pins included in the first pin group from the second hold position to the open position, a second circumferential direction movement step in which, after the second movement step, the second movement unit is controlled to move in the circumferential direction the support portion of each of the movable pins included in the second pin group from the third hold position to the fourth hold position with respect to the spin base, and a third movement step in which, after completion of the second circumferential direction movement step, the first support portion movement unit is controlled to move the support portion of each of the movable pins included in the first pin group from the open position to the first hold position.

7. The substrate holding/rotating device according to claim 2, wherein
the first support portion movement unit includes a first annular magnet which is formed in a circular annular shape around the rotation axis and is movable along the rotation axis between a lower position and an upper position higher than the lower position,
a first switching mechanism, coupled to the first annular magnet, that transmits a movement of the first annular magnet between the lower position and the upper position to each of the movable pins included in the first pin group so as to switch the support portion of each of the movable pins included in the first pin group between the hold position and the open position,
a first elevated/lowered magnet which opposes a lower side of the first annular magnet and has a magnetic pole direction that imparts a repulsive force or an attractive force to the first annular magnet, and
a first lifter which elevates and lowers the first elevated/lowered magnet between an upper position at which the first elevated/lowered magnet imparts the repulsive force or the attractive force to the first annular magnet and a lower position at which the repulsive force or the attractive force imparted by the first elevated/lowered magnet to the first annular magnet is smaller than that at the upper position, thereby to move the first annular magnet along the rotation axis between the lower position thereof and the upper position thereof,
the second support portion movement unit includes
a second annular magnet which is formed in a circular annular shape around the rotation axis and is movable along the rotation axis between a lower position and an upper position higher than the lower position,
a second switching mechanism, coupled to the second annular magnet, that transmits a movement of the second annular magnet between the lower position and the upper position to each of the movable pins included in the second pin group so as to switch the support portion of each of the movable pins included in the second pin group between the hold position and the open position,
a second elevated/lowered magnet which opposes a lower side of the second annular magnet and has a magnetic pole direction which imparts a repulsive force or an attractive force to the second annular magnet, and
a second lifter which elevates and lowers the second elevated/lowered magnet between an upper position at which the second elevated/lowered magnet imparts the repulsive force or the attractive force to the second annular magnet and a lower position at which the repulsive force or the attractive force imparted by the second elevated/lowered magnet to the second annular magnet is smaller than that at the upper position, thereby to move the second annular magnet along the rotation axis between the lower position thereof and the upper position thereof.

8. The substrate holding/rotating device according to claim 2, wherein
the first support portion movement unit includes
a first urging magnet which urges the support portion of each of the movable pins included in the first pin group to one of the open position and the hold position,
a first driving magnet fixed to each of the movable pins included in the first pin group and having a magnetic pole direction orthogonal to the rotation axis, a magnetic force of the first urging magnet being imparted to the first driving magnet,
a third elevated/lowered magnet which has a magnetic pole direction that imparts a repulsive force or an attractive force to the first driving magnet in a direction orthogonal to the rotation axis, thereby to urge the support portion of each of the movable pins included in the first movable pin group to the other of the open position and the hold position by the repulsive force or the attractive force, and a third lifter which elevates and lowers the third elevated/lowered magnet between an upper position at which the third elevated/lowered magnet imparts the repulsive force or the attractive force to the first driving magnet and a lower position at which the repulsive force or the attractive force imparted by the third elevated/lowered magnet to the first driving magnet is smaller than that at the upper position, and the second support portion movement unit includes a second urging magnet which urges the support portion of each of the movable pins included in the second pin group to one of the open position and the hold position, a second driving magnet fixed to each of the movable pins included in the second pin group and having a magnetic pole direction orthogonal to the rotation axis, a magnetic force of the second urging magnet being imparted to the second driving magnet, a fourth elevated/lowered magnet which has a magnetic pole direction that imparts a repulsive force or an attractive force to the second driving magnet in a direction orthogonal to the rotation axis, thereby to urge the support portion of each of the movable pins included in the second movable pin group to the other of the open position and the hold position by the repulsive force or the attractive force, and a fourth lifter which elevates and lowers the fourth elevated/lowered magnet between an upper position at which the fourth elevated/lowered magnet imparts the repulsive force or the attractive force to the second driving magnet and a lower position at which the repulsive force or the attractive force imparted by the fourth elevated/lowered magnet to the second driving magnet is smaller than that at the upper position.

9. The substrate holding/rotating device according to claim 8, wherein the third elevated/lowered magnet and the fourth elevated/lowered magnet are each provided in plural numbers equal to each other, and the plurality of third elevated/lowered magnets and the plurality of fourth elevated/lowered magnets are arranged alternately in the circumferential direction so as to form a circular annular shape coaxial to the rotation axis as a whole.

10. The substrate holding/rotating device according to claim 1, wherein the hold position of the support portion of each of the movable pins included in the second pin group includes a third hold position and a fourth hold position defined with respect to the spin base, the fourth hold position being apart from the third hold position in the circumferential direction, the support portion of each of the movable pins included in the second pin group being movable in the circumferential direction between the third hold position and the fourth hold position with respect to the spin base, a second movement unit that causes the second pin support member to move rotationally relatively with respect to the spin base around the rotation axis, thereby to move the support portion of each of the movable pins included in the second pin group directly in the circumferential direction between the third hold position and the fourth hold position without moving through the open position.

11. The substrate holding/rotating device according to claim 10 further comprising:

a first rotational movement regulating structure that regulates a rotational movement range of the first pin support member with respect to the spin base to a predetermined angle range; and a second rotational movement regulating structure that regulates a rotational movement range of the second pin support member with respect to the spin base to a predetermined angle range; wherein the first rotational movement regulating structure includes a first long hole which is formed in the first pin support member to extend in the circumferential direction, and a first insertion pin which is disposed upright on the spin base to insert through the first long hole, and the second rotational movement regulating structure includes a second long hole which is formed in the second pin support member to extend in the circumferential direction, and a second insertion pin which is disposed upright on the spin base to insert through the second long hole.

12. The substrate holding/rotating device according to claim 11, wherein the first pin support member extends radially in three directions from a center thereof arranged on the rotation axis with an equal interval in the circumferential direction, the second pin support member extends radially in three directions from a center thereof arranged on the rotation axis with an equal interval in the circumferential direction, and the first pin support member deviates from the second pin support member in rotational phase around the rotation axis.

13. The substrate holding/rotating device according to claim 1, wherein the second pin support member is coupled to the spin base such that the second pin support member is not rotatable around the rotation axis with respect to the spin base.

14. The substrate holding/rotating device according to claim 1, wherein the first pin support member is a plate-shaped member arranged along an upper surface of the spin base, and the second pin support member is a plate-shaped member arranged along the upper surface of the spin base.

15. A substrate processing apparatus comprising:

a substrate holding/rotating device which rotates a substrate around a rotation axis extending along a vertical direction, while holding the substrate horizontally; and a processing liquid supplying unit which supplies a processing liquid to a principal surface of the substrate held by the substrate holding/rotating device, the substrate holding/rotating device including a spin base provided to be rotatable around the rotation axis, and a plurality of movable pins arranged along a circumference centered on the rotation axis, the movable pins each having a support portion configured contact with a peripheral edge portion of the substrate to support the substrate, wherein the plurality of movable pins include a first pin group which includes at least three movable pins and a second pin group which includes at least three movable pins, the support portion of each of the movable pins included in the first pin group is disposed so as to move between a hold position close to the rotation axis and an open position further away from the rotation axis than the hold position, the hold position including a first hold position and a second hold position defined with respect to the spin base, the second hold position being apart from the first hold position in a circumferential direction around the rotation axis, the support portion of each of the movable pins included in the first pin group being movable in the circumferential direction between the first hold position and the second hold position with respect to the spin base, and the support portion of each of the movable pins included in the second pin group is disposed so as to move between a hold position close to the rotation axis and an open position further away from the rotation axis than the hold position, the substrate holding/rotating device further including a first pin support member that supports the movable pins included in the first pin group, the first pin support member coupled to the spin base so as to rotate together with the spin base around the rotation axis such that the first pin support member is rotationally relatively movable around the rotation axis with respect to the spin base, thereby to move the support portion of each of the movable pins included in the first pin group in the circumferential direction between the first hold position and the second hold position with respect to the spin base when the support portion of each of the movable pins included in the first pin group is at the hold position thereof, a second pin support member, provided separately from the first pin support member, that supports the movable pins included in second pin group, the second pin support member coupled to the spin base so as to rotate together with the spin base around the rotation axis, a motor for rotating the spin base, the first pin support member and the second pin support member together around the rotation axis, and a first movement unit which causes the first pin support member to move rotationally relatively with respect to the spin base around the rotation axis, wherein when the support portion of each of the movable pins included in the first pin group is at the hold position and also the support portion of each of the movable pins included in the second pin group is at the open position, the substrate can be supported by each of the movable pins included in the first pin group, the first movement unit rotates the first pin support member relative to the spin base around the rotation axis, whereby the support portion of each of the movable pins included in the first pin group is moved directly in the circumferential direction between the first hold position and the second hold position without moving through the open position.

16. The substrate processing apparatus according to claim 15 further comprising a controller which controls the motor and the processing liquid supplying unit, wherein the controller is programmed to execute a liquid processing step in which a processing liquid is supplied by the processing liquid supplying unit to the principal surface of the substrate to process the substrate, while the substrate held by the substrate holding/rotating device is rotated around the rotation axis by the motor.

17. The substrate processing apparatus according to claim 16, wherein where the support portion of each of the movable pins included in the second pin group is at the hold position and the support portion of each of the movable pins included in the first pin group is at the open position, the substrate can be supported by each of the movable pins included in the second pin group, the substrate holding/rotating device further includes a first support portion movement unit which moves the support portion of each of the movable pins included in the first pin group between the open position and the hold position, and a second support portion movement unit which moves the support portion of each of the movable pins included in the second pin group between the open position and the hold position, the controller further controls the first movement unit, the first support portion movement unit and the second support portion movement unit, and the controller is programmed to execute a first circumferential direction movement step in which, in a state that each of the movable pins included in the first pin group is at the hold position and each of the movable pins included in the second pin group is at the open position, the support portion of each of the movable pins included in the first pin group is moved in the circumferential direction by the first movement unit from the first hold position to the second hold position with respect to the spin base, and a first movement step in which, after completion of the first circumferential direction movement step, the support portion of each of the movable pins included in the second pin group is moved by the second support portion movement unit from the open position to the hold position, in parallel with the liquid processing step.

18. The substrate processing apparatus according to claim 15, wherein the second pin support member is coupled to the spin base such that the second pin support member is not rotatable around the rotation axis with respect to the spin base.

19. The substrate processing apparatus according to claim 15, wherein the first pin support member is a plate-shaped member arranged along an upper surface of the spin base, and the second pin support member is a plate-shaped member arranged along the upper surface of the spin base.

* * * * *